US012532761B2

(12) United States Patent
Hsiao et al.

(10) Patent No.: US 12,532,761 B2
(45) Date of Patent: Jan. 20, 2026

(54) MIM CAPACITOR IN IC HETEROGENOUS INTEGRATION

(71) Applicant: Taiwan Semiconductor Manufacturing Company, Ltd., Hsin-Chu (TW)

(72) Inventors: Tsung-Chieh Hsiao, Changhua County (TW); Chung-Yun Wan, Changhua County (TW); Liang-Wei Wang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 305 days.

(21) Appl. No.: 18/336,413

(22) Filed: Jun. 16, 2023

(65) Prior Publication Data

US 2024/0421063 A1   Dec. 19, 2024

(51) Int. Cl.
*H01L 23/00* (2006.01)
*H01L 23/50* (2006.01)
(Continued)

(52) U.S. Cl.
CPC .............. *H01L 23/50* (2013.01); *H01L 24/02* (2013.01); *H01L 24/05* (2013.01); *H01L 24/08* (2013.01); *H01L 24/09* (2013.01); *H01L 25/18* (2013.01); *H01L 25/50* (2013.01); *H10B 80/00* (2023.02); *H10D 1/692* (2025.01); *H01L 2224/0231* (2013.01); *H01L 2224/02381* (2013.01); *H01L 2224/05569* (2013.01);
(Continued)

(58) Field of Classification Search
None
See application file for complete search history.

(56) References Cited

U.S. PATENT DOCUMENTS

| | | | |
|---|---|---|---|
| 6,934,143 B2 | 8/2005 | Chou et al. | |
| 7,195,970 B2 | 3/2007 | Tu et al. | |

(Continued)

FOREIGN PATENT DOCUMENTS

| | | | |
|---|---|---|---|
| CN | 114975377 A | 8/2022 | |
| TW | 202203377 A | 1/2022 | |

*Primary Examiner* — Thao P Le
(74) *Attorney, Agent, or Firm* — HAYNES AND BOONE, LLP

(57) ABSTRACT

One aspect of the present disclosure pertains to a method. The method includes receiving a first circuit structure having semiconductor devices, an interconnect structure, first feedthrough vias, top metal lines, redistribution vias, and bond pads. The method includes dicing the first circuit structure to form a top die having a top semiconductor device. The method includes forming a stacked integrated circuit (IC) structure by bonding the top die to a second circuit structure, the second circuit structure having second semiconductor devices, a second interconnect structure, second redistribution vias, and second bond pads. The method includes forming IC top metal lines over the first feedthrough vias, forming an IC passivation layer over the IC top metal lines, forming metal-insulator-metal (MIM) capacitor structures in the IC passivation layer, and forming IC redistribution vias penetrating through the MIM capacitor structures and the IC passivation layer to land on the IC top metal lines.

20 Claims, 30 Drawing Sheets

(51) Int. Cl.
  *H01L 25/00*    (2006.01)
  *H01L 25/18*    (2023.01)
  *H10B 80/00*    (2023.01)
  *H10D 1/68*     (2025.01)

(52) U.S. Cl.
  CPC ............ *H01L 2224/05624* (2013.01); *H01L 2224/08145* (2013.01); *H01L 2224/09103* (2013.01); *H01L 2224/09181* (2013.01); *H01L 2924/1431* (2013.01); *H01L 2924/1437* (2013.01)

(56) References Cited

U.S. PATENT DOCUMENTS

| | | |
|---|---|---|
| 7,557,399 B2 | 7/2009 | Tu et al. |
| 9,269,761 B2 | 2/2016 | Pan et al. |
| 9,287,350 B2 | 3/2016 | Yang |
| 9,941,195 B2* | 4/2018 | Liao ............... H01G 4/306 |
| 10,553,672 B2 | 2/2020 | Huang et al. |
| 11,362,065 B2* | 6/2022 | Chen ............... H01L 23/528 |
| 11,532,695 B2 | 12/2022 | Yin et al. |
| 12,183,723 B2* | 12/2024 | Su ............... H01L 24/16 |
| 2015/0380388 A1* | 12/2015 | Yu ............... H01L 21/6835 257/737 |
| 2016/0020170 A1* | 1/2016 | Ho ............... H01L 21/76805 257/774 |
| 2020/0027851 A1* | 1/2020 | Ting ............... H01L 21/561 |
| 2022/0302108 A1* | 9/2022 | Thei ............... H01L 23/562 |
| 2023/0044797 A1* | 2/2023 | Su ............... H01L 23/562 |
| 2023/0260896 A1* | 8/2023 | Hu ............... H01L 23/3114 |
| 2024/0079392 A1* | 3/2024 | Wang ............... H01L 21/561 |
| 2024/0421063 A1* | 12/2024 | Hsiao ............... H01L 25/0657 |
| 2025/0132294 A1* | 4/2025 | Chen ............... H01L 24/19 |

* cited by examiner

MIM CAPACITOR IN IC HETEROGENOUS INTEGRATION

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Many of the technological advances have occurred in the field of 3D IC packaging, which involves stacking and bonding multiple chips together. Each chip includes at least one functional IC, such as an IC configured to perform a logic function, a memory function, a digital function, an analog function, a mixed signal function, a radio frequency (RF) function, an I/O function, a communications function (e.g., provides support for wired communications and/or wireless communications by implementing desired communication protocols, such as 5G (i.e., 5th generation) wireless communications protocols, Ethernet communications protocols, IB communications protocols, etc.), a power management function, other function, or combinations thereof.

With continued advances in 3D IC stacking technology, integrated chips have become more versatile and highly heterogenous. These highly integrated devices may experience large current spikes during operations of certain circuits, such as during periods of simultaneous switching, which can induce noise, voltage bias fluctuation, and current resistance drop (RC delay) on the power network. Specifically, the voltage on the power supply line may fluctuate when the transition time of the transient current is particularly short or when the line's parasitic inductance or parasitic resistance is large. As such, passive devices such as capacitors may be used as part of the 3D IC for signal conditioning. Specifically, filtering or decoupling capacitors may be used, acting as temporary charge reservoirs to prevent momentary fluctuations in supply voltage. To improve capacitance density in a 3D IC stacked structure, super high density metal-insulator-metal (MIM) capacitors may be used.

However, as 3D IC multi-chip devices become denser and more interconnected, the decoupling capacitors (e.g., MIM capacitors) may not be effectively utilized. For example, depending on signal path, certain signals of the stacked devices remain unfiltered or minimally filtered. That is, the decoupling capacitors are not effectively coupled to the power signal line for optimal filtering of noise due to certain signal lines bypassing the decoupling capacitors.

Therefore, while existing methods and structures related to decoupling capacitors in 3D IC devices are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1A:
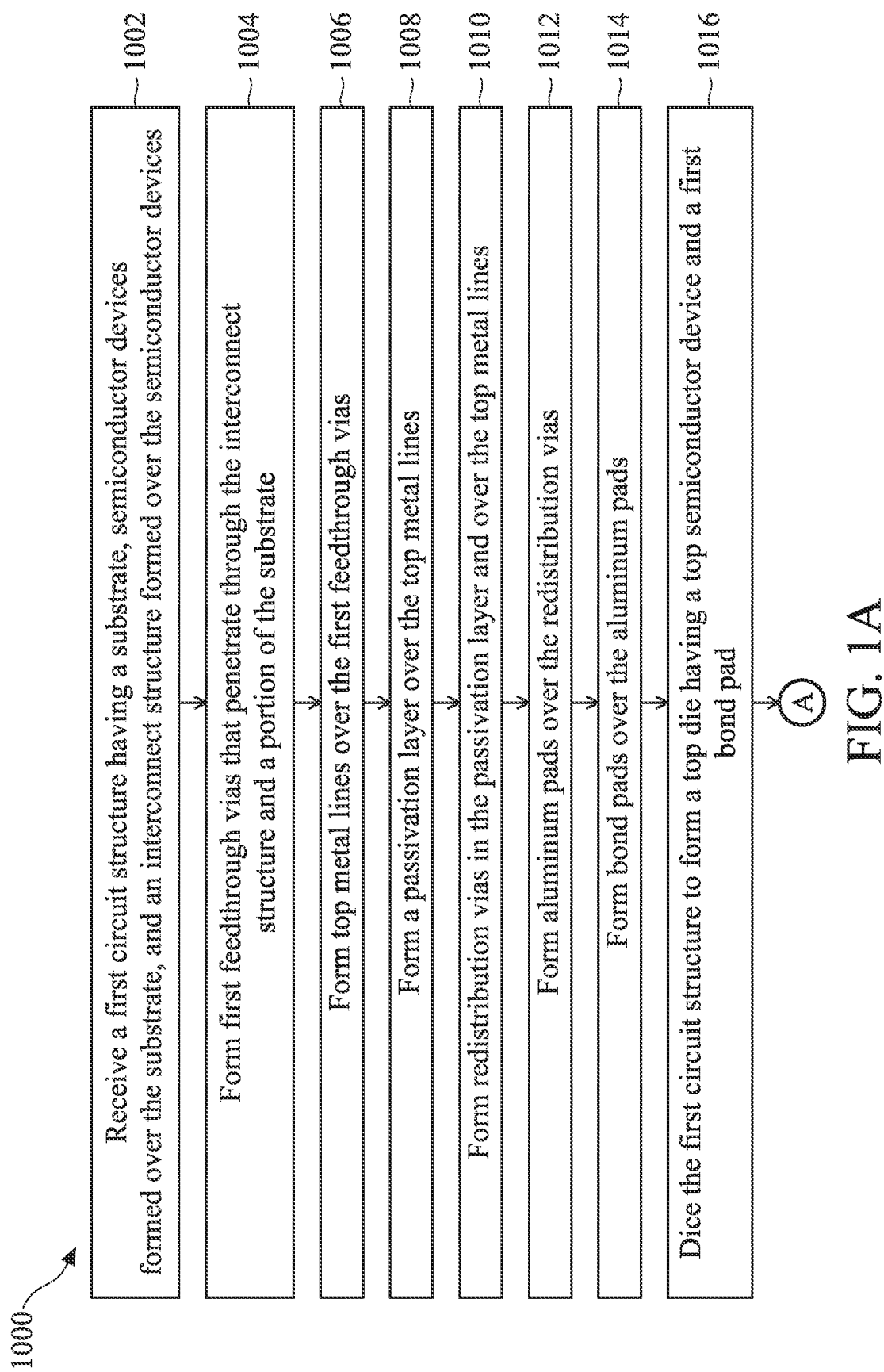
FIGS. 1A-1B illustrate a flow chart of a method to form a stacked semiconductor structure having one or more MIM capacitors, according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower." "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described, or other values as understood by person skilled in the art. For example, the term "about 5 nm" may encompass the dimension range from 4.5 nm to 5.5 nm.

The present disclosure relates to methods and structures directed to forming 3D integrated circuit (IC) structures having filtering or decoupling capacitors. The 3D IC structures are stacked structures with heterogenous integration, for example having logic devices stacked over memory devices, or vice versa. The filtering or decoupling capacitors include multi-layer MIM capacitors that filter noise in various signal paths. These signal paths may include power signals traveling from top IC bond pads to various devices in the 3D IC structures, or they may include signal paths between devices in the 3D IC structures. To ensure signals do not bypass the MIM capacitors, some of the MIM capacitors are formed closer to the top of the 3D IC structure. This allows coupling between the input power signals and the MIM capacitors before the power signals travel to the devices in the 3D IC structure. For example, the MIM capacitors are formed both above transistor regions of bottom devices (e.g., memory devices) and transistor regions of top devices (e.g., logic devices), and the power signals coming from the top of the 3D IC structure travels through the MIM capacitors before reaching the top and/or bottom devices. Forming MIM capacitors closer to the input power signals ensures that the MIM capacitors are formed along the power signal paths before the power signals reach their destination devices. These MIM capacitors may be referred to as IC-level MIM capacitors. The present disclosure also contemplates other MIM capacitors that are more region specific. These MIM capacitors may condition signals that are only traveling to the bottom devices, top devices, or between top and bottom devices.

Figure 1B:

FIGS. 1A-1B is a flow chart of a method 1000 to form a stacked semiconductor structure 100 having one or more MIM capacitors. Method 1000 is described below with reference to FIGS. 2-15, which illustrate the formation of a stacked semiconductor structure 100 at intermediate stages of fabrication and processed in accordance with the method 1000. Additional operations can be provided before, during, and after the method 1000, and some of the operations described can be moved, replaced, or eliminated for additional embodiments of method 1000.

Figure 2:
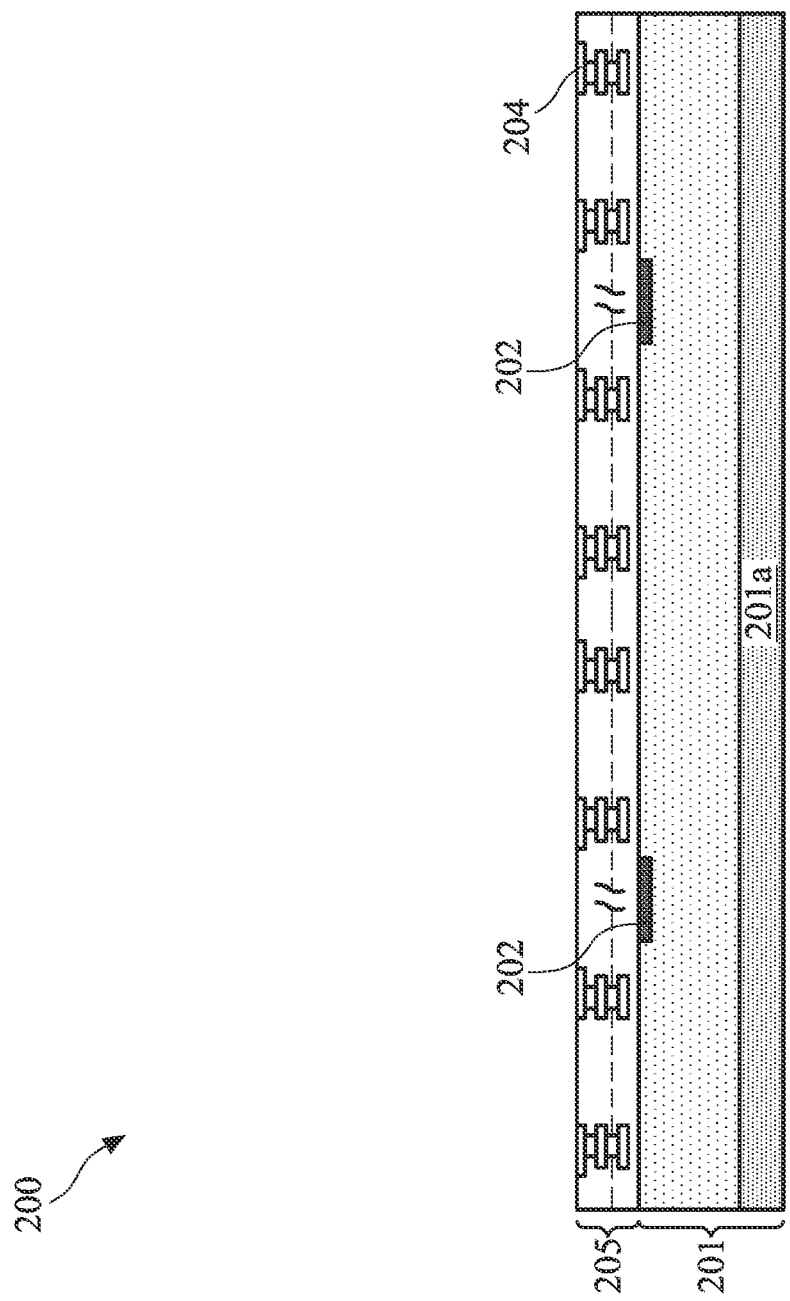
FIGS. 2-15 illustrate the formation of a stacked semiconductor structure at intermediate stages of fabrication and processed in accordance with the method of FIGS. 1A-1B, according to an embodiment of the present disclosure.

Referring to FIG. 2, the method 1000 at operation 1002 receives or is provided with a first circuit structure 200 having a substrate 201, semiconductor devices 202 formed over or within the substrate 201, and an interconnect structure 205 formed over the semiconductor devices 202. The first circuit structure 200 may be part of a first wafer having first semiconductor devices 202. The semiconductor devices 202 may be formed in a transistor region of the substrate 201. The first semiconductor devices 202 may be logic devices for arithmetic, logic, controlling, and I/O operations. The substrate 201 may be a silicon (Si) substrate, or a substrate having other semiconductor materials such as germanium (Ge), silicon carbide (SiC), silicon germanium (SiGe), or diamond. In an embodiment, the substrate may include an insulator layer 201a below a top portion of the substrate 201. The insulating layer 201a may include a dielectric material such as silicon oxide. In another embodiment, the insulator layer 201a is not present. The semiconductor devices 202 may include device-level structures that form the semiconductor devices 202. These structures may include semiconductor features such as semiconductor channels, gate structures over the semiconductor channels, and source/drain features adjacent the semiconductor channels.

Still referring to FIG. 2, the interconnect structure 205 is formed over the semiconductor devices 202. The interconnect structure 205 includes features that electrically couple various devices (for example, transistors, resistors, capacitors, and/or inductors) and/or components (for example, gate structures and/or source/drain features of the semiconductor devices 202), such that the various devices and/or components can operate as specified by design requirements. The interconnect structure 205 includes a combination of dielectric layers such as interlayer dielectric (ILD) layers and electrically conductive layers. The conductive layers are configured to form vertical interconnect features, such as metal vias, and/or horizontal interconnect features, such as conductive metal lines. Vertical interconnect features typically connect horizontal interconnect features in different layers (or different planes) of the interconnect structure 205. During operation, the interconnect structure 205 is configured to route signals between the devices 202 and/or the components of the devices 202 and/or distribute signals (for example, clock signals, voltage signals, and/or ground signals) to the devices 202 and/or the components of the devices 202. The interconnect structure 205 may also include guard ring structures 204. The guard ring structures 204 are metal features (e.g., copper lines) that protect the devices 202 and other structures in the substrate 201 when forming feedthrough vias 206 (see FIG. 3). The guard ring structures may include layers of metal vias and metal lines surrounded by an ILD layer.

Figure 3:
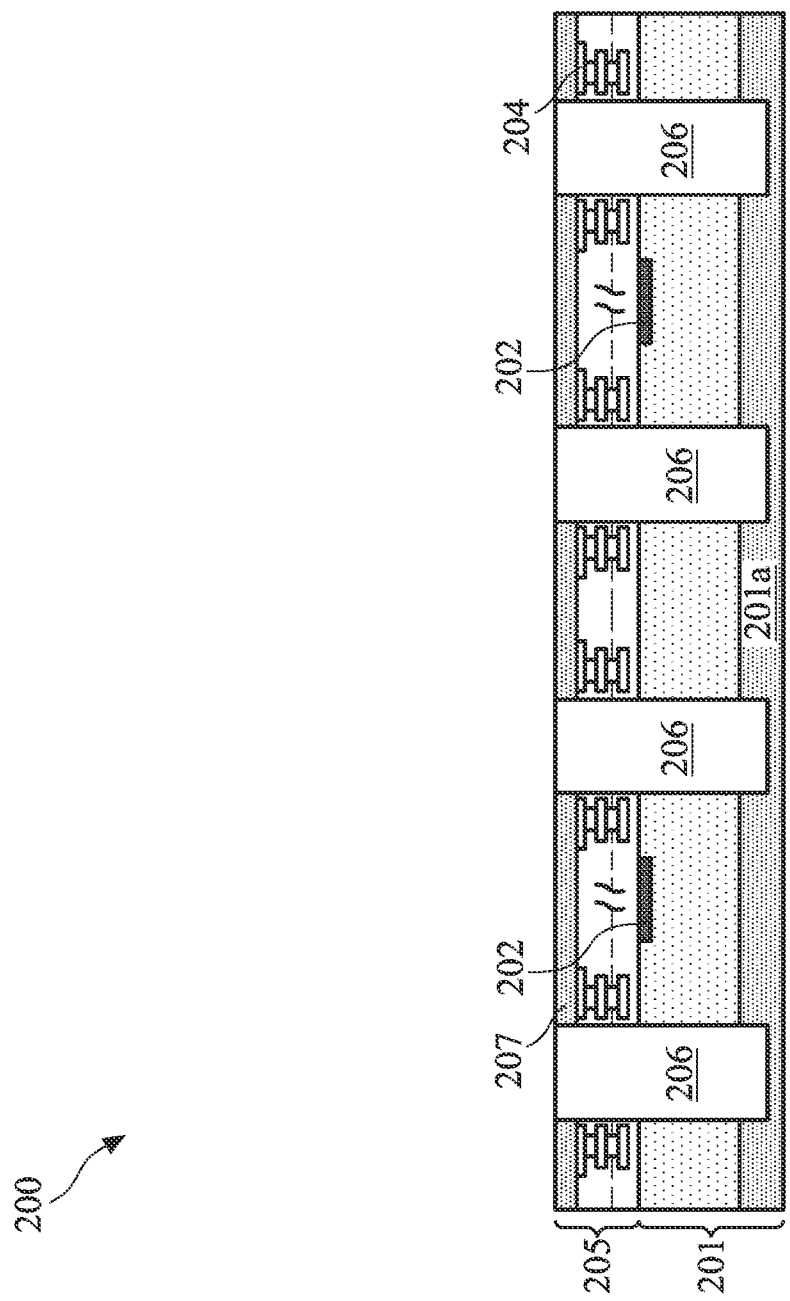

Now referring to FIG. 3, the method 1000 at operation 1004 forms first feedthrough vias 206 that penetrate through the interconnect structure 205 and a portion of the substrate 201. For example, as shown, the first feedthrough vias 206 penetrate through a top portion of the substrate 201 to land on the insulator layer 201a. Also shown, the first feedthrough vias 206 may penetrate a portion of the insulator layer 201a. The first feedthrough vias 206 (also referred to as interconnect vias) may be formed by first depositing a dielectric layer (e.g., an ILD layer 207) over the first circuit structure 200, performing a patterning and lithography process to form first feedthrough via trenches through the dielectric layer, the interconnect structure 205, and a portion of the substrate 201, then filling the first feedthrough via trenches with metal features. As noted previously, the guard ring structures 204 provide protection to the devices 202 and other structures in the substrate 201 when forming the feedthrough vias 206. For example, the guard ring structures 204 provide structural integrity when forming the feedthrough via trenches and blocks unwanted moistures, etchant and chemicals from reaching device-level structures in the substrate 201 during the lithography process and field applications.

Figure 4:
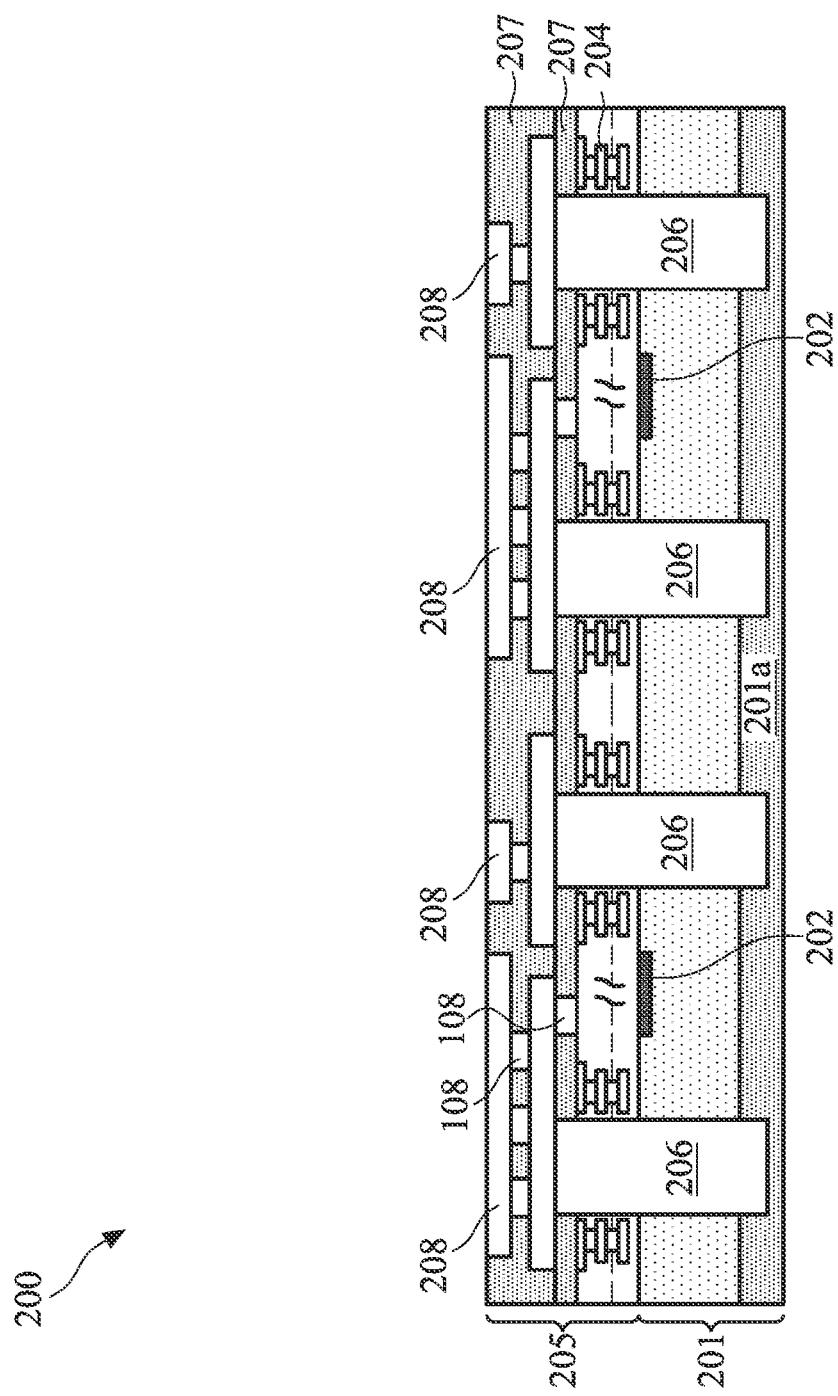

Now referring to FIG. 4, the method 1000 at operation 1006 forms other portions of the interconnect structure 205 including top metal lines 208 over the first feedthrough vias 206. As shown, the top metal lines 208 may include several metal line layers connected by metal vias 108. These top metal lines 208 are still part of the interconnect structure 205 and are metal lines in the top metal layer of the interconnect structure 205. As shown, metal line layers of the top metal lines 208 may land on the first feedthrough vias 206 or other vias 108 in the interconnect structure 205.

Figure 5:
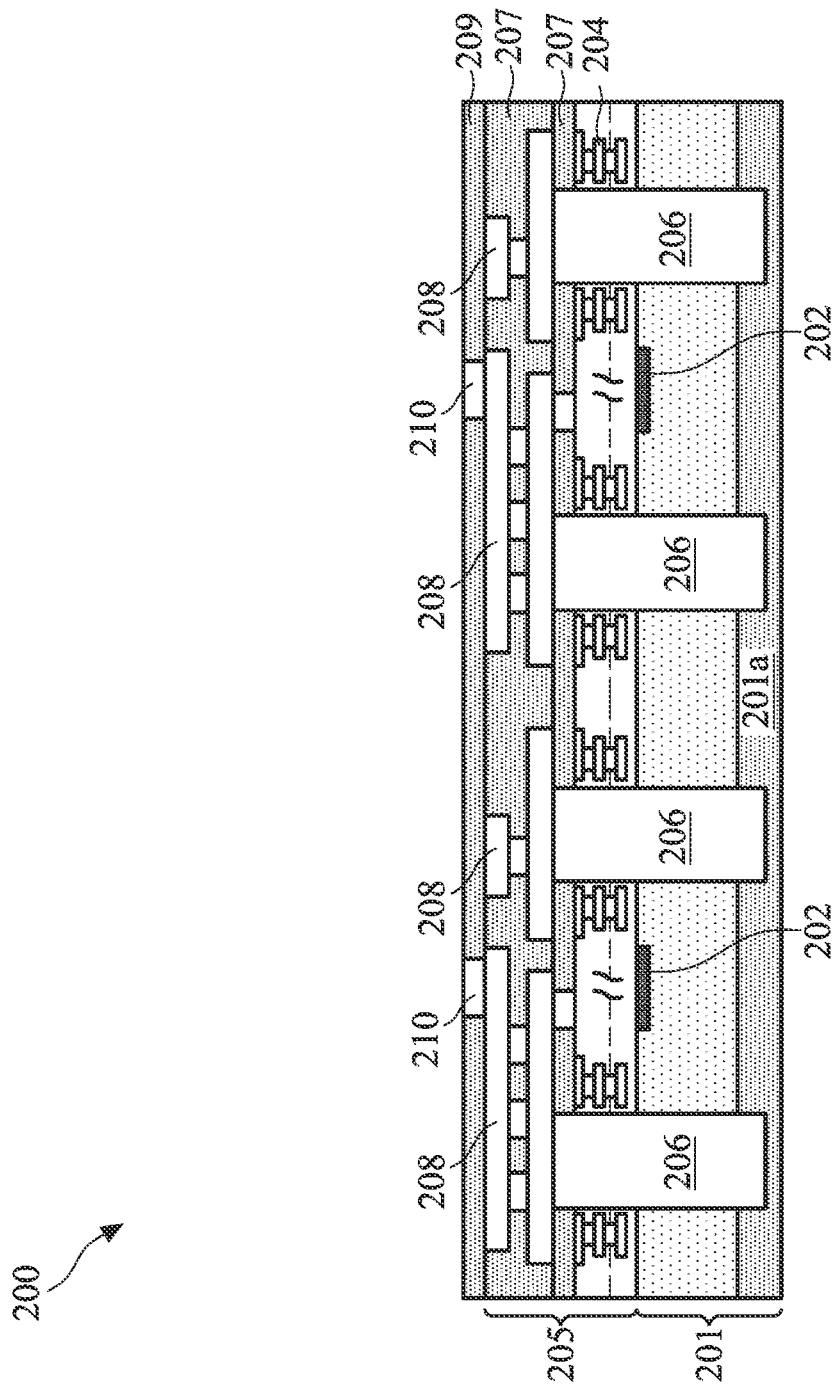

Now referring to FIG. 5, the method 1000 at operation 1008 forms a passivation layer 209 having a dielectric material over the top metal lines 208. Still referring to FIG. 5, the method 1000 at operation 1010 forms redistribution vias 210 in the passivation layer 209 and over the top metal lines 208. The redistribution vias 210 includes a metal material such as copper and lands on the top metal layers of the top metal lines 208.

Figure 6:
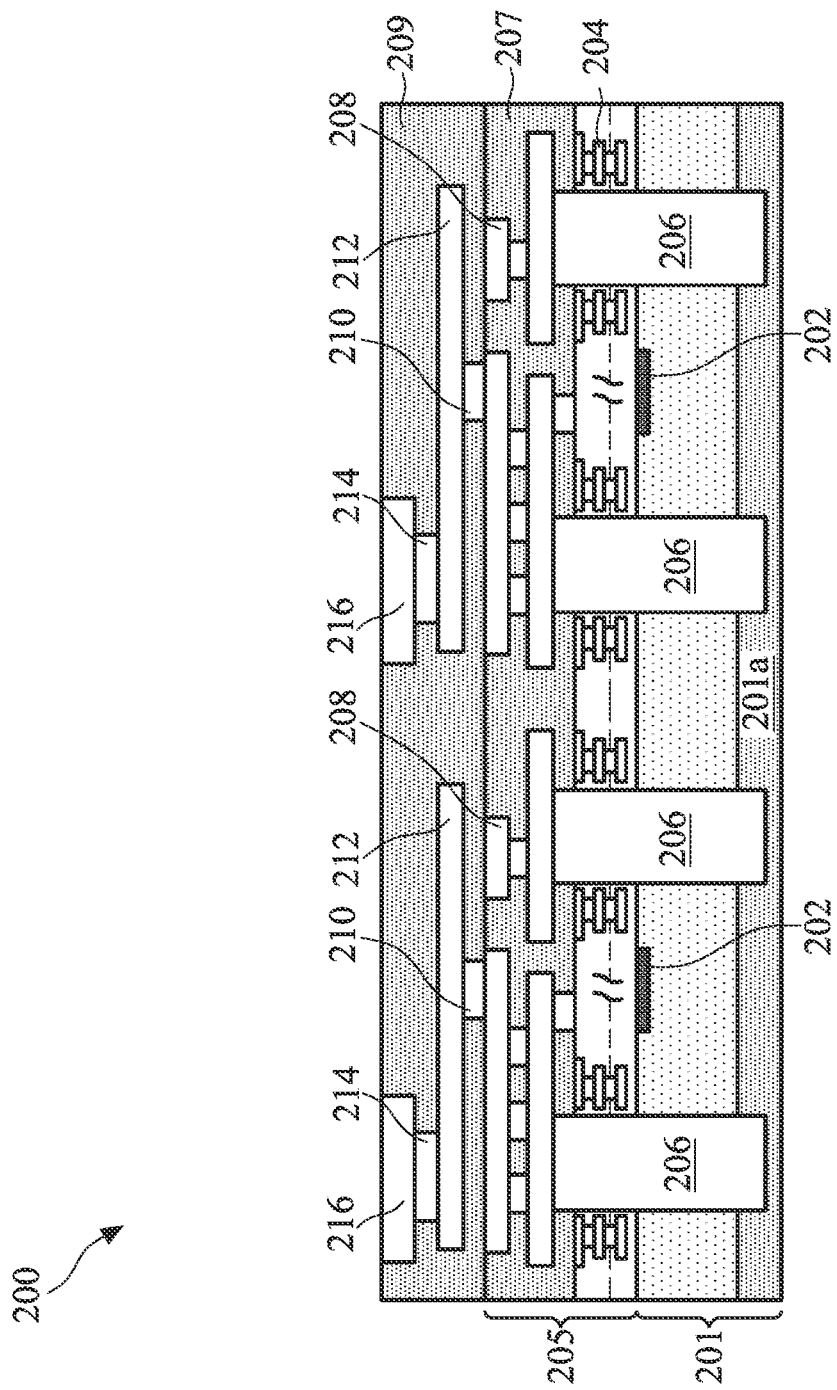

Now referring to FIG. 6, the method 1000 at operation 1012 forms aluminum pads 212 over the redistribution vias 210. The aluminum pads 212 land on the redistribution vias 210 and are formed in the passivation layer 209. The passivation layer 209 may be multilayered (not shown for simplicity), where the passivation layer has a sub layer for each metal formed in that sub layer of the passivation layer 209. Still referring to FIG. 6, the method 1000 at operation 1014 forms bond pads 216 over and electrically connected to the aluminum pads 212. For example, as shown, method 1000 forms bond pad vias 214 over and landing on the aluminum pads 212, and bond pads 216 over and landing on the bond pad vias 214. Each of these features may be formed in different sub layers of the passivation layer 209. The redistribution vias 210, the aluminum pads 212, and the bond pad vias 214 are different parts of a redistribution layer (RDL) structure. The RDL structure may include additional redistribution routing lines. Redistribution vias 210 are vias connecting the RDL structure to the top metal lines 208 and the bond pad vias 214 are vias connecting the RDL structure to the bond pads 216.

Figure 7:
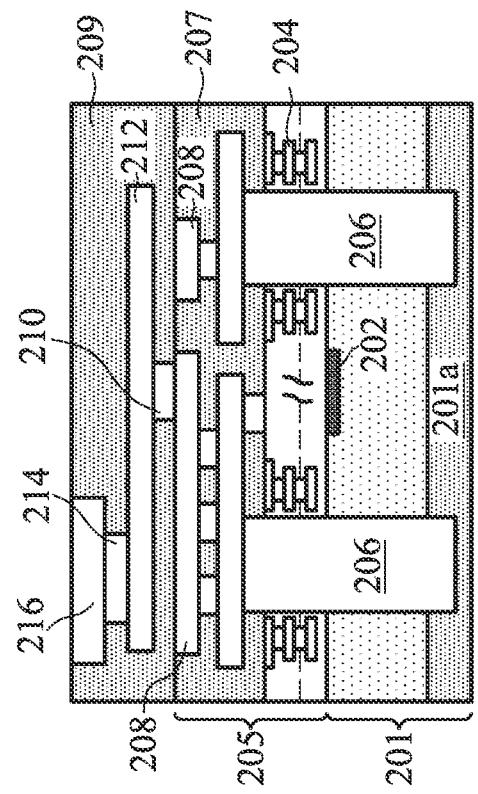

Now referring to FIG. 7, the method 1000 at operation 1016 dices the first circuit structure 200 to form a top die 250 having a top semiconductor device 202 and a first bond pad 216. As part of or before the operation 1016, the method 1000 may do probe testing on the top die 250 to determine if it suitable for later processing and integration.

Figure 8:
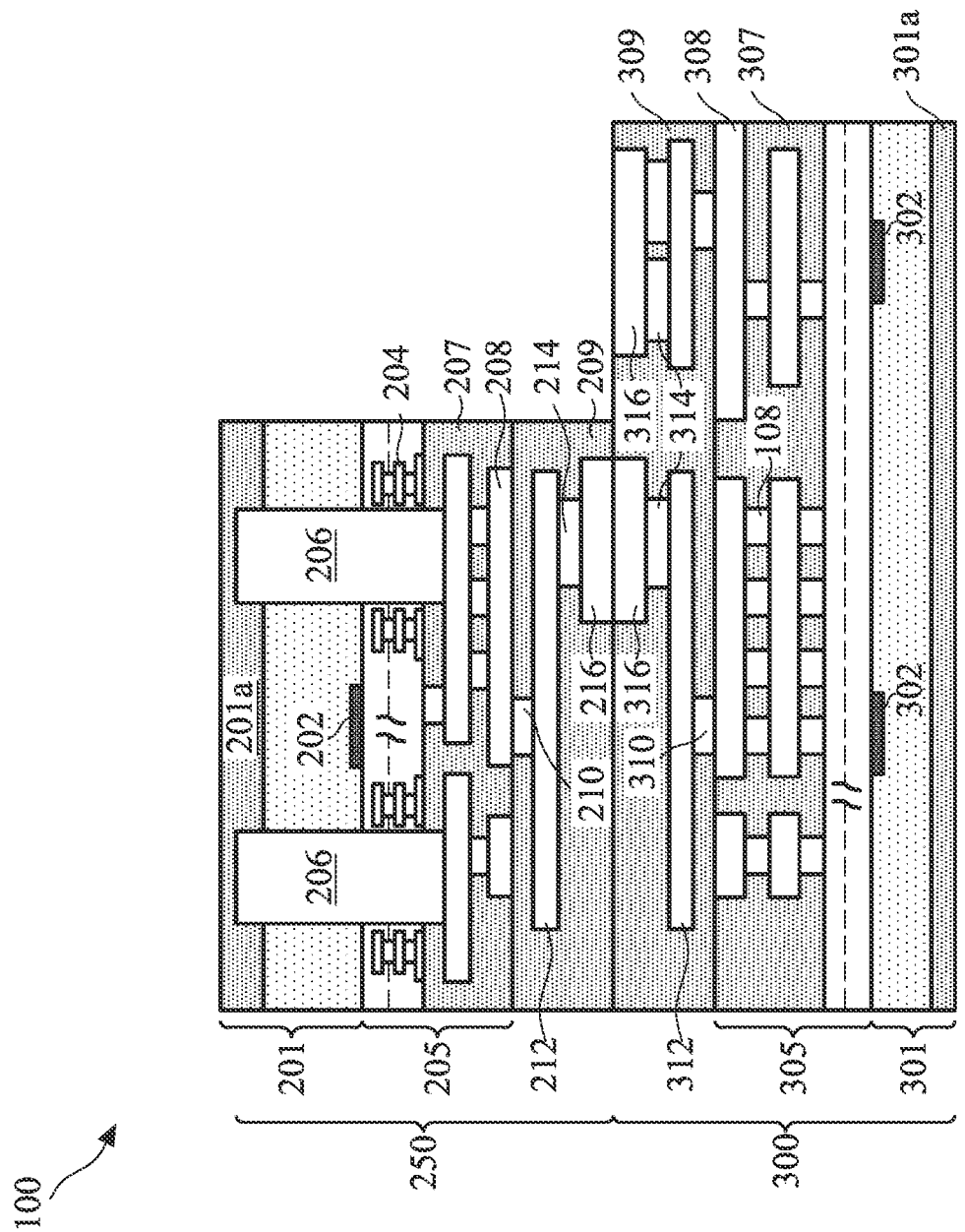

Now referring to FIG. 8, the method 1000 at operation 1018 forms a stacked IC structure 100 by bonding the top die 250 to a second circuit structure 300. The second circuit structure 300 may be part of a second wafer having second semiconductor devices 302. The second semiconductor devices 302 may be formed in a transistor region of a second substrate 301. The second semiconductor devices 302 may be memory devices such as SRAM devices for storage and read/write operations. The second circuit structure 300 may resemble the first circuit structure 200 (see FIG. 6) except that there are no feedthrough vias formed therein. As shown, the second circuit structure 300 includes a second substrate 301, second semiconductor devices 302 formed over or within the second substrate 301, a second interconnect structure 305 formed over the second semiconductor devices 302, second redistribution vias 310 over the second interconnect structure 305, second aluminum pads 312 over the second redistribution vias 310, second bond pad vias 314 over the second aluminum pads 312, and second bond pads 316 over the second bond pad vias 314.

The second substrate 310 may include a second insulator layer 301a much like the insulator layer 201a. The second interconnect structure 305 may include second top metal lines 308 and vias 108 between metal line layers formed in a dielectric layer (e.g., ILD layer 307). The second redistribution vias 310, the aluminum pads 312, the second bond pad vias 314, and the second bond pads 316 are formed in a passivation layer 309. The second redistribution vias 310, the second aluminum pads 312, and the second bond pad vias 314 are different parts of a second RDL structure. The second RDL structure may include additional redistribution routing lines. The second redistribution vias 310 are vias connecting the second RDL structure to the second top metal lines 308 and the second bond pad vias 314 are vias connecting the second RDL structure to the second bond pads 316. Note that the second circuit structure 300 is not a die and may include one or more semiconductor devices 302. As such, the second circuit structure 300 may include more devices than the top die 250. In the illustrative example, the second circuit structure 300 may include two memory devices while the top die 250 includes one logic device.

Still referring to FIG. 8, the top die 250 bonds to the second circuit structure 300 through a flip chip process where the frontside of the top die 250 bonds to the frontside of the second circuit structure 300. Specifically, the bond pad 216 of the top die 250 bonds to a bond pad 316 of the second bond pads 316. As such, one or more devices 202 may be vertically stacked over one or more devices 302.

Figure 9:
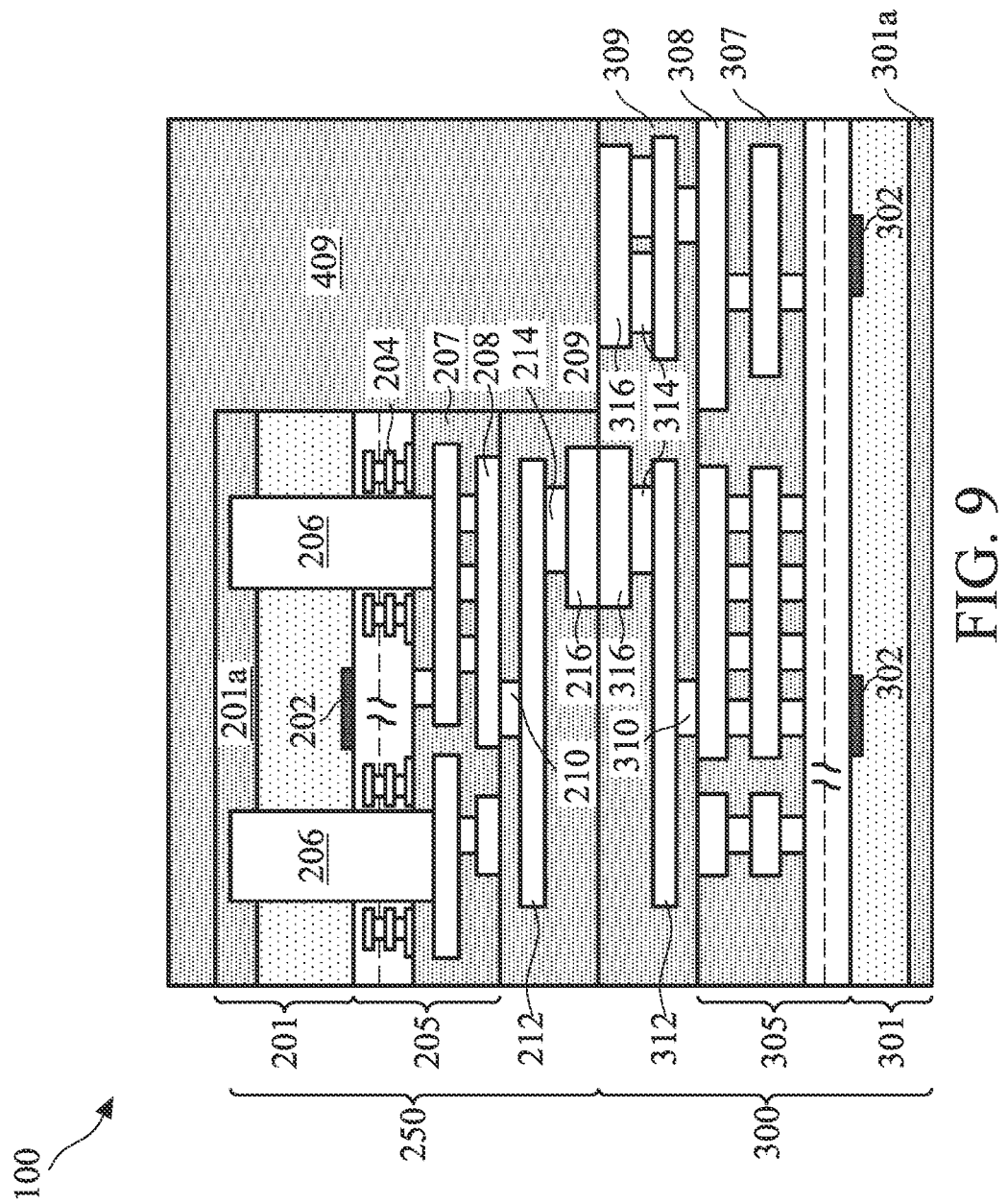

Now referring to FIG. 9, the method 1000 at operation 1020 performs a gap fill process over the stacked IC structure 100, the gap fill process fills a gap adjacent the top die 250 with a dielectric fill layer 409. The gap fill process may be any suitable deposition process. The dielectric fill layer 409 may land on the substrate 201, the passivation layer 309, and another bond pad 316.

Figure 10:
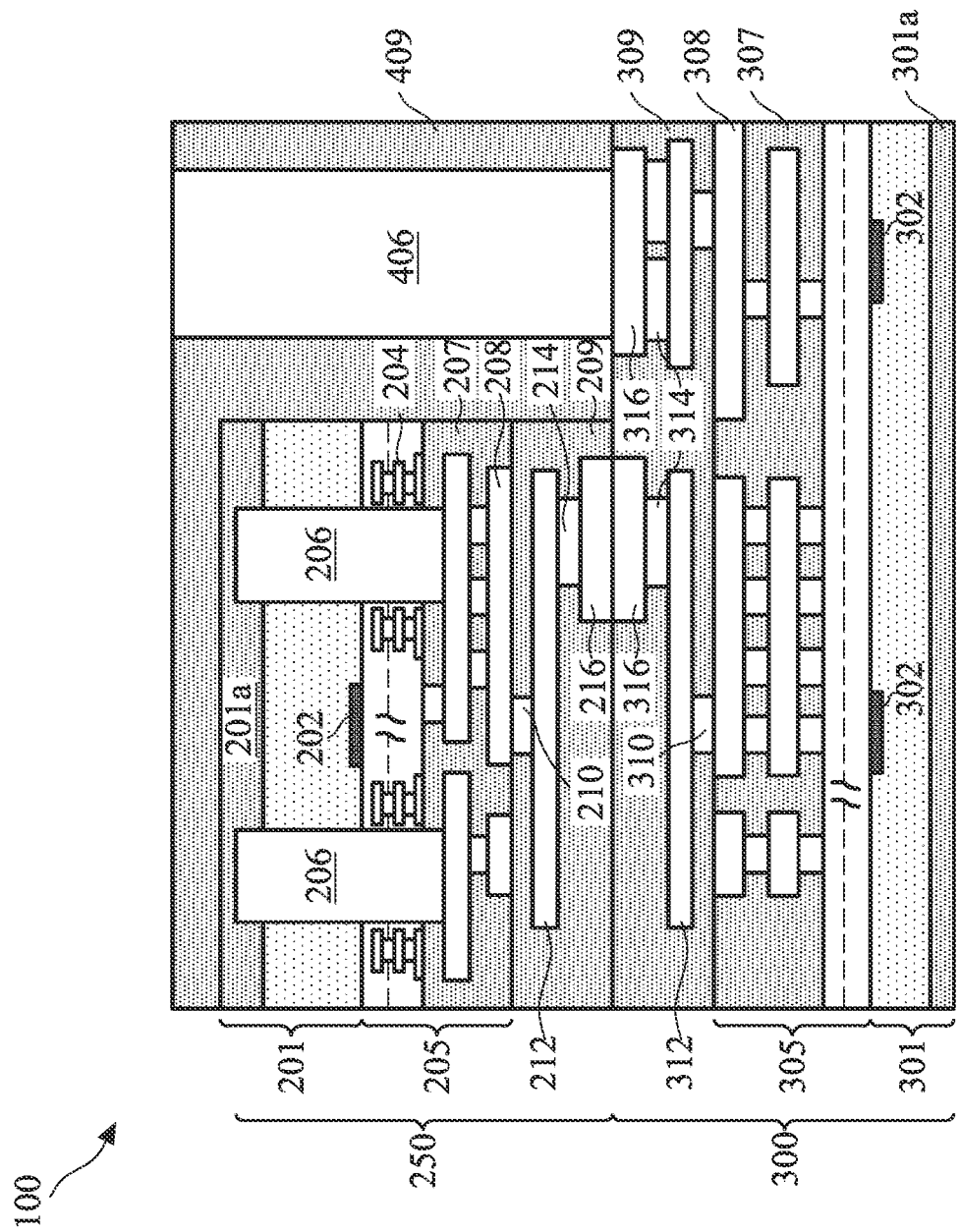

Now referring to FIG. 10, the method 1000 at operation 1022 forms a second feedthrough via 406 (also referred to as a bypass via) that penetrates through the dielectric fill layer 409 and landing on a bond pad 316 of the second circuit structure 300. The second feedthrough via 406 is a bypass via that bypasses the top die 250 to connect the second circuit structure 300 to IC top metal lines (formed later). Note that the second feedthrough via 406 has a greater height in the vertical direction than the first feedthrough vias 206. The formation of the second feedthrough via 406 is similar to that of the first feedthrough vias 206 and includes patterning and deposition.

Figure 11:
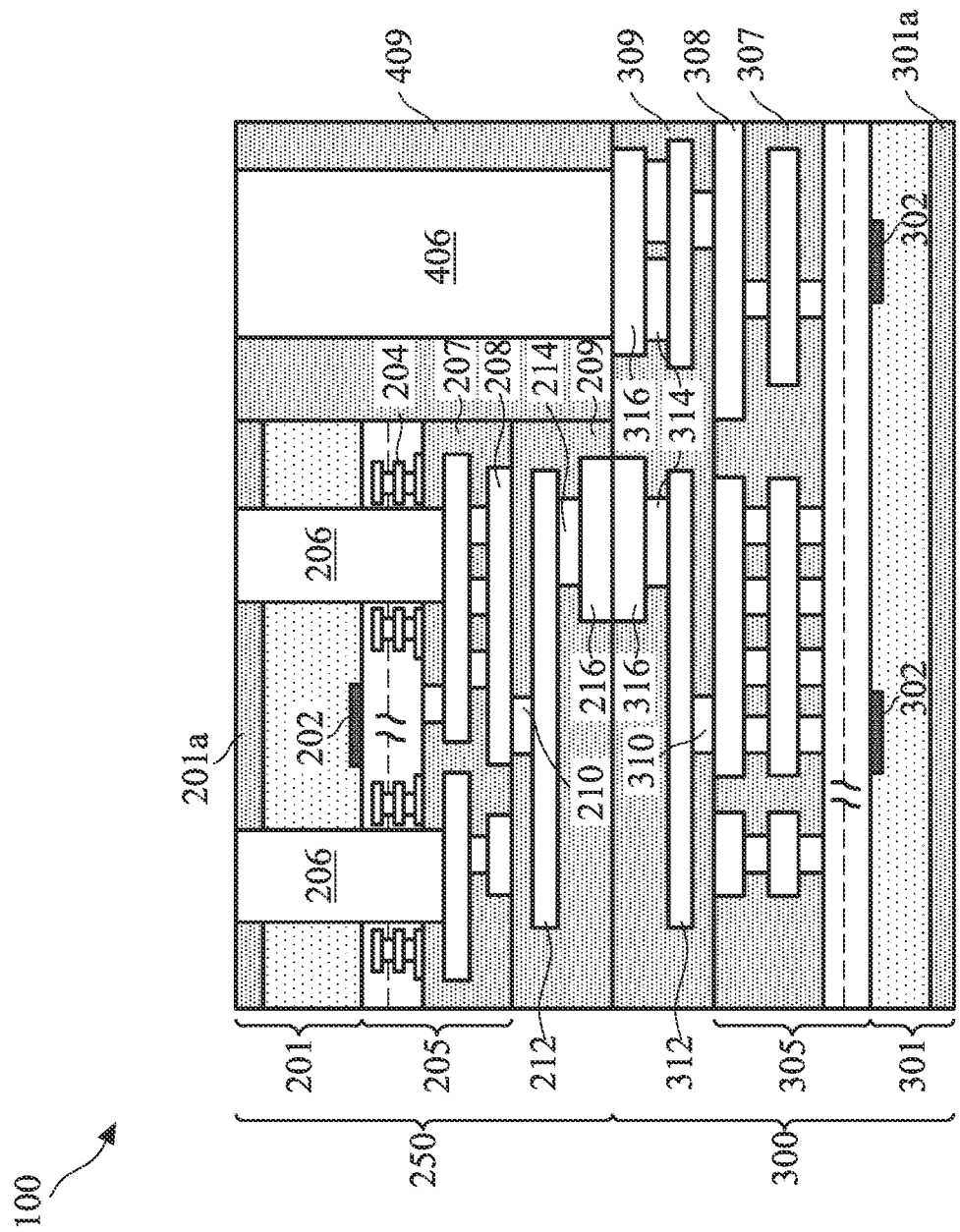

Now referring to FIG. 11, the method 1000 at operation 1024 performs a planarization process (e.g., CMP process) to expose top surfaces of the first feedthrough vias 206 and a top surface of the second feedthrough via 406.

Figure 12:
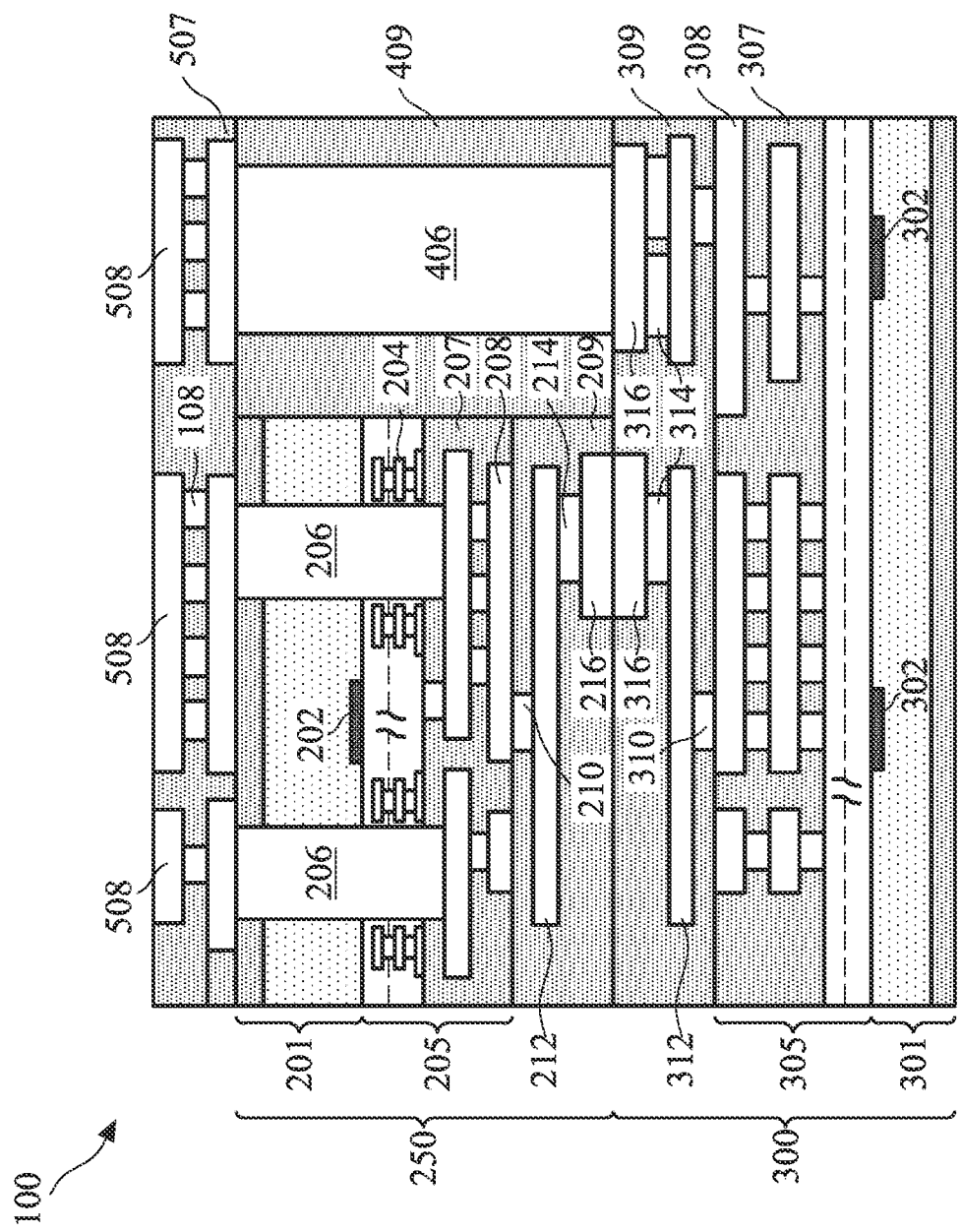

Now referring to FIG. 12, the method 1000 at operation 1026 forms an interconnect structure on the backside of the top die 250, so being referred to as a backside interconnect structure. The backside interconnect structure may include metal lines and vias distributed in one or more metal layers. The backside interconnect structure includes IC top metal lines 508 over the first feedthrough vias 206 and the second feedthrough via 406. The IC top metal lines 508 may include several metal line layers connected by metal vias 108. The IC top metal lines 508 are electrically connected to and may land on the first feedthrough vias 206 and/or the second feedthrough via 406. The IC top metal lines 508 are formed in another ILD layer 507.

Figure 13:
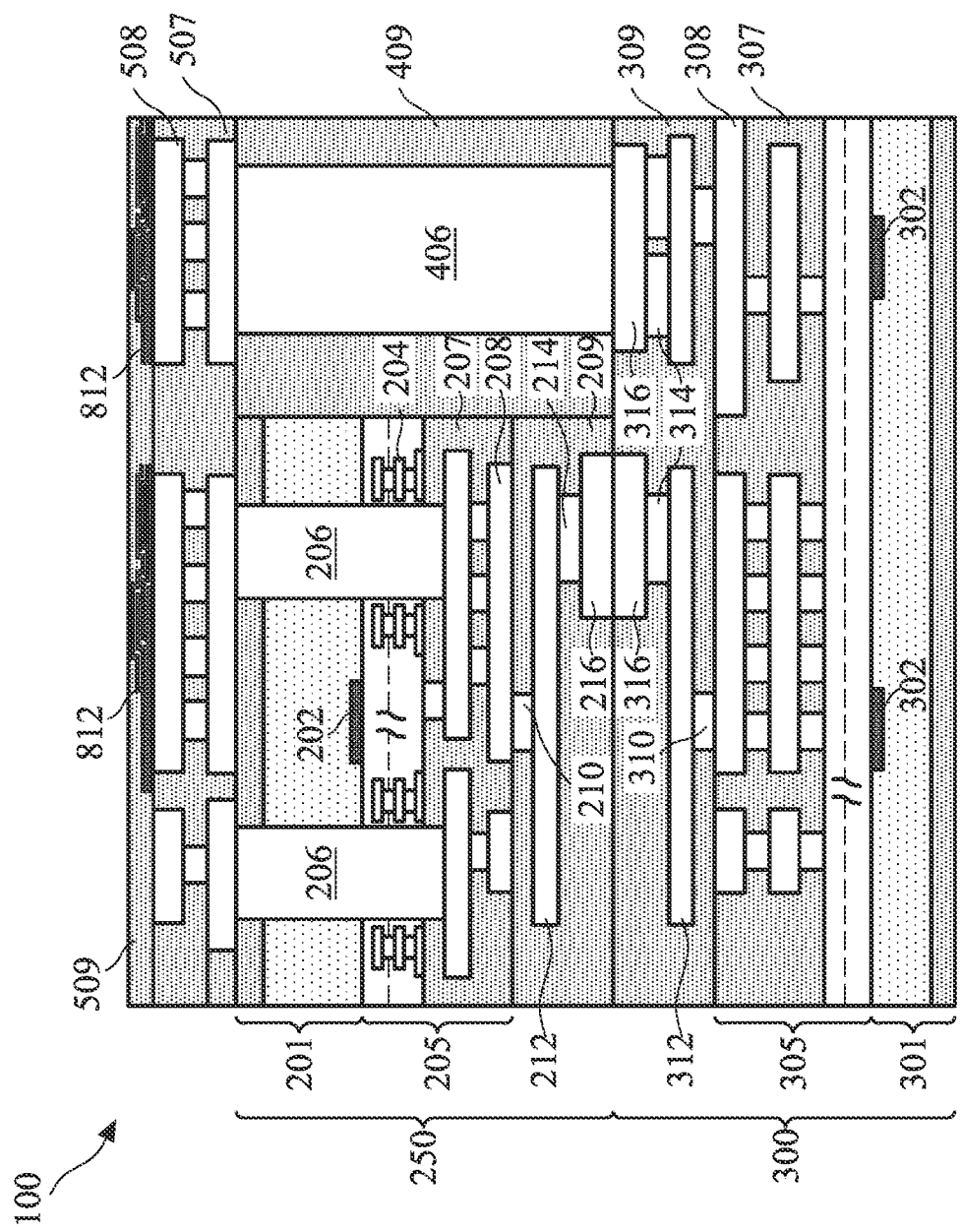

Now referring to FIG. 13, the method 1000 at operation 1028 forms MIM capacitor structures 812 over the IC top metal lines 508. The MIM capacitor structures 812 includes multiple conductor plate layers that are separated from one another by insulator layers (e.g., high-k dielectric layers). The MIM capacitor structures 812 may be formed through multiple processes, including those for formation and patterning of a bottom conductor plate, a middle conductor plate, a top conductor plate, or additional conductor plates. The multiple processes also include those for formation and patterning of a bottom insulator layer, a middle insulator layer, a top insulator layer, or additional insulator layers.

That is, the MIM capacitor structures 812 may include multiple metal conductor plate layers intertwined with multiple insulator layers. The multi-layer MIM capacitor structures 812 allows capacitors to be closely packed together in both vertical and lateral directions, thereby reducing the amount of lateral space needed for implementing capacitors. As a result, the MIM capacitor structures 812 may accommodate super high-density capacitors.

Still referring to FIG. 13, the MIM capacitor structure 812 are formed in an IC passivation layer 509. For example, the IC passivation layer 509 is first deposited over the workpiece and then the MIM capacitor structures 812 are formed within the IC passivation layer 509 by a suitable patterning and lithography process.

Figure 14:
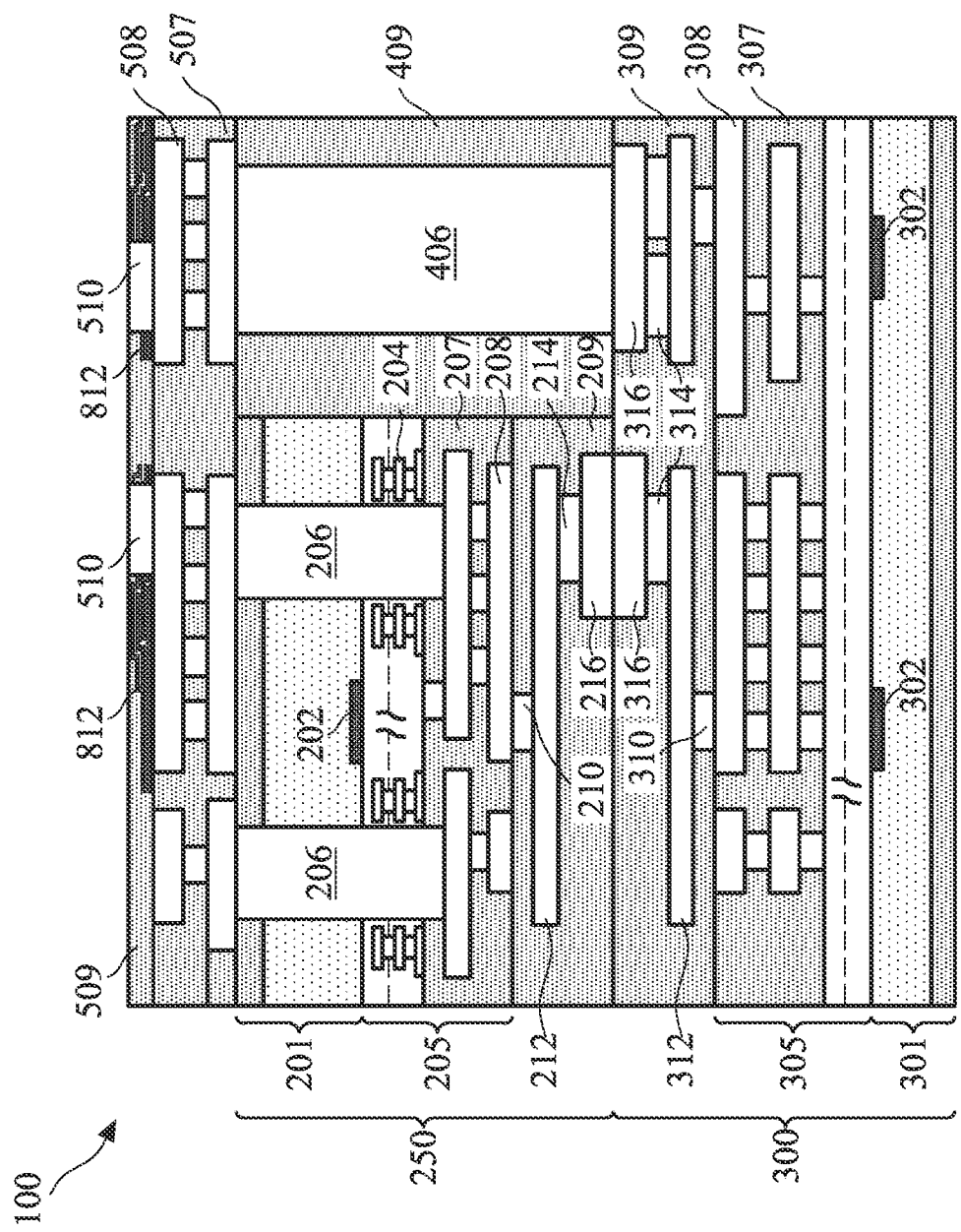
Figure 14A:
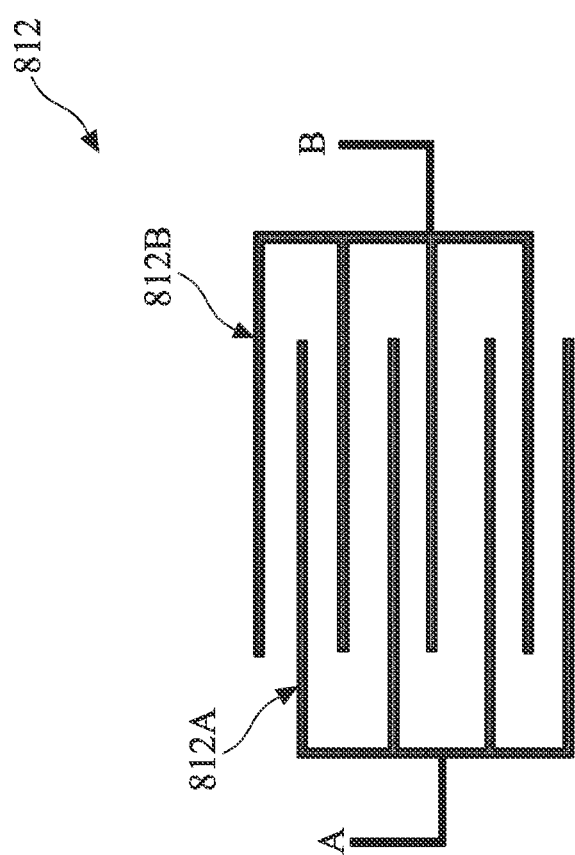

Now referring to FIG. 14, the method 1000 at operation 1030 forms IC redistribution vias 510 over the IC top metal lines 508 and through the MIM capacitor structures 812. The IC redistribution vias 510 land on the IC top metal lines 508 and penetrates through a portion of the MIM capacitor structures 812 (i.e., portion that connects to one end of the capacitor electrode, for example, capacitor electrode A or B in FIG. 14A). FIG. 14A shows a MIM capacitor structure 812 having first conductor plates 812A connected to capacitor electrode A and second conductor plates 812B connected to capacitor electrode B. The IC redistribution vias 510 may electrically couple to capacitor electrode A by penetrating through and contacting first conductor plates 812A of the MIM capacitor structures 812. In this case, the electrode B may be connected to a ground power line (not shown). Alternatively, The IC redistribution vias 510 may electrically couple to capacitor electrode B by penetrating through and contacting second conductor plates 812B of the MIM capacitor structures 812. In this case, the electrode A may be connected to a ground power line (not shown).

Figure 15:
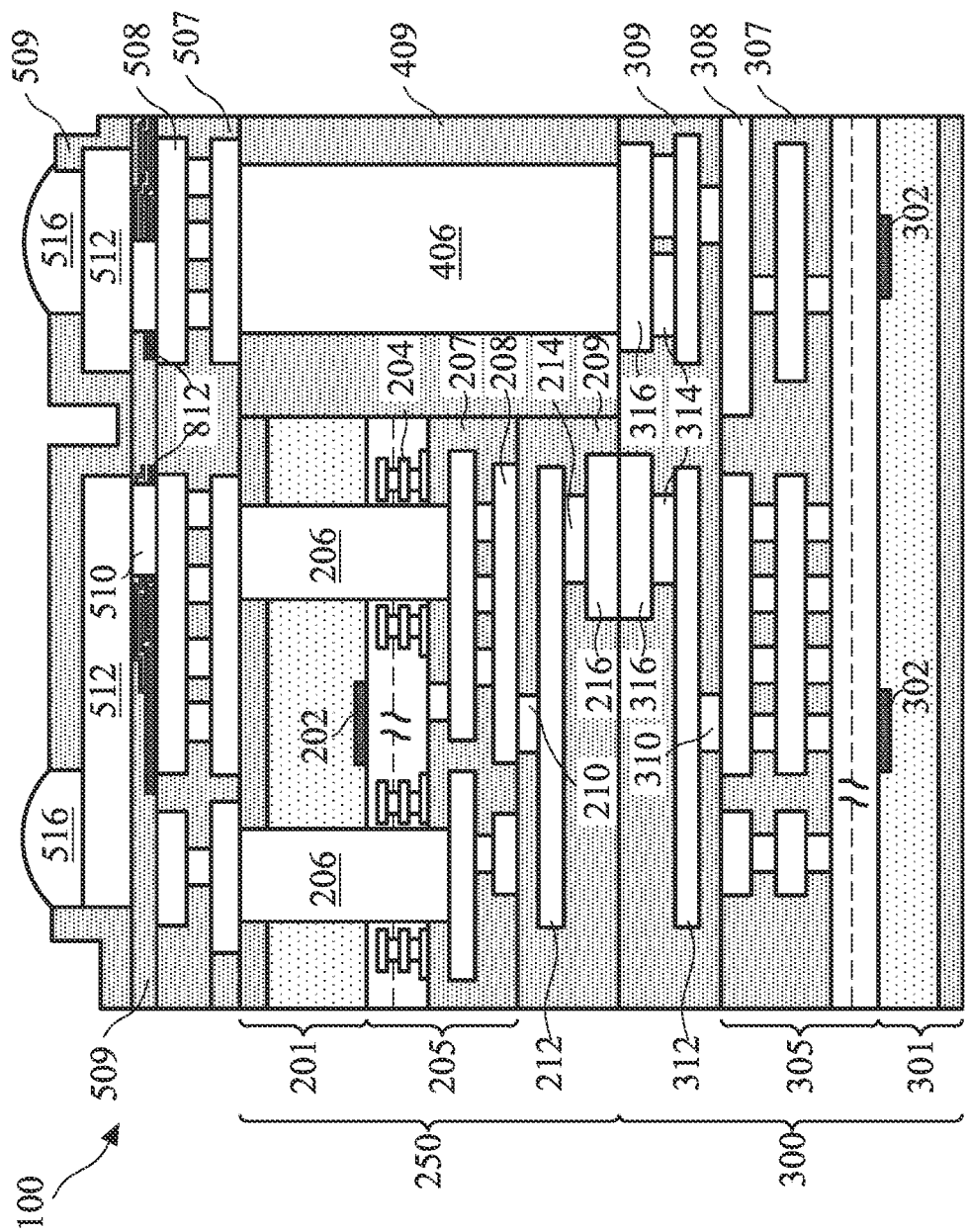

Now referring to FIG. 15, the method 1000 at operation 1032 forms IC aluminum pads 512 over the IC redistribution vias 510. Still referring to FIG. 15, the method 1000 at operation 1034 forms IC bond pads 516 over the IC aluminum pads 512. The IC aluminum pads 512 and IC bond pads 516 may be formed in the IC passivation layer 509. Like the passivation layers 209 and 309, the IC passivation layer 509 may be multilayered, where the passivation layer has sub layers separately formed that surround the different metal features (e.g., IC redistribution vias 510, IC aluminum pads 512, and IC bond pads 516). The IC redistribution vias 510 and the IC aluminum pads 512 are different parts of an IC RDL structure. The IC RDL structure may include additional redistribution routing lines or vias. The IC redistribution vias 510 are vias connecting the IC RDL structure to the IC top metal lines 508. In an embodiment, the IC bond pads 516 are where input power signals are received.

Figure 16:
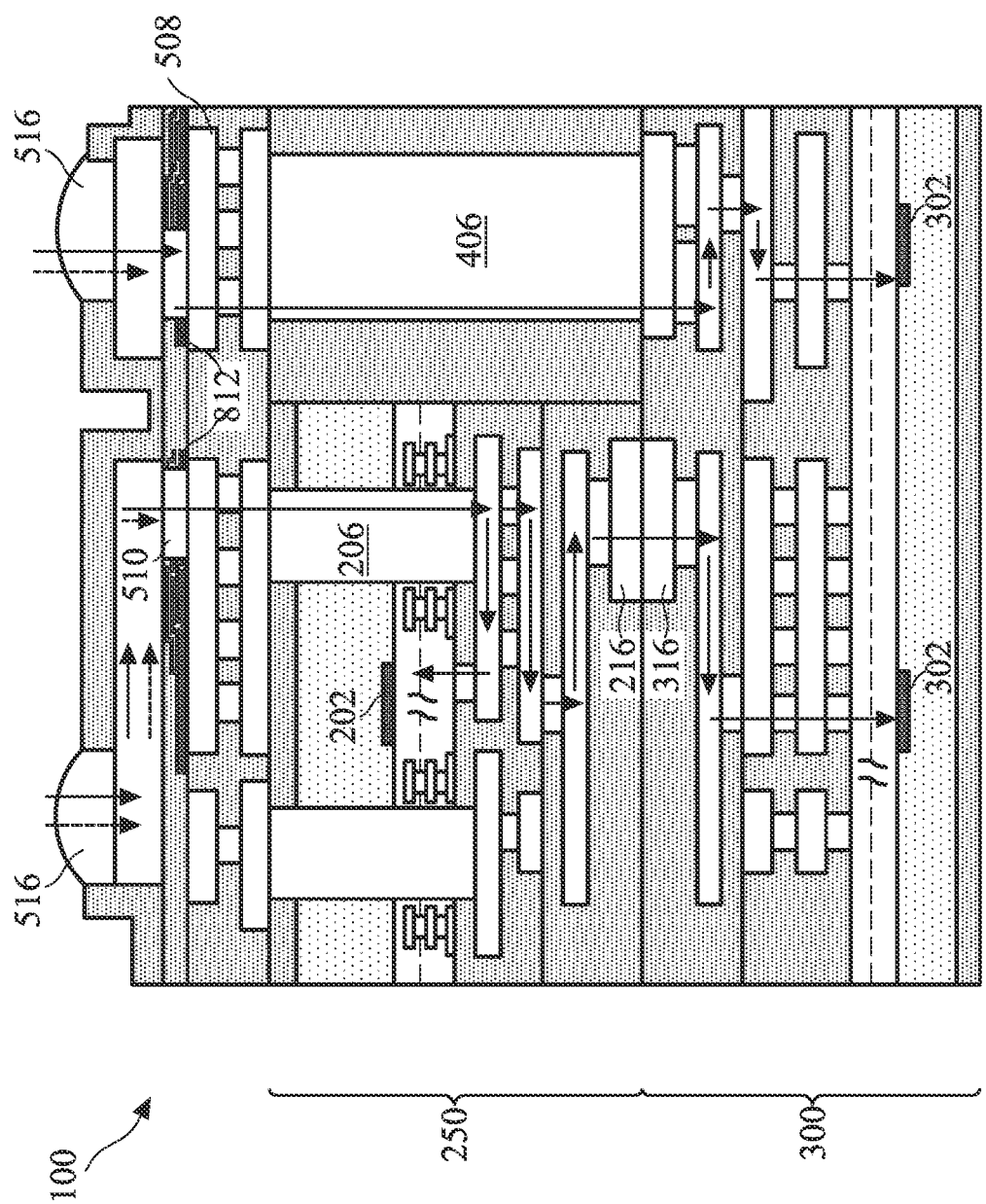
FIG. 16 illustrate a stacked semiconductor structure having one or more integrated MIM capacitors to filter received power signals, according to an embodiment of the present disclosure.

FIG. 16 illustrate the stacked semiconductor structure 100 of FIG. 15. Additionally, FIG. 16 shows solid and dashed arrows representing input power signals. The arrows demonstrate how the one or more integrated MIM capacitors 812 filter the received input power signals, according to an embodiment of the present disclosure. As shown, the stacked semiconductor structure 100 receives input power signals through the IC bond pads 516. The input power signals may include desired power signals (solid arrows) and undesired noise such as frequency spikes (dashed arrows). The input power signals travel through various metal features (bond pads, aluminum pads, redistribution layers, metal lines, interconnects, vias, etc.) to power respective semiconductor devices 202 and 302. As shown, due to the MIM capacitor structures 812 in the signal path, undesired noise is filtered out and do not reach the respective semiconductor devices 202 and 302. Specifically, the MIM capacitor structures 812 are coupled to the IC redistribution vias 510 in a top IC-level portion of the stacked semiconductor structure 100. The MIM capacitor structures 812 short the undesired noise (dashed arrows) to a ground power line (not shown) such that only the desired power signals (solid arrows) travel through the IC redistribution vias 510 down the IC top metal lines 508 through a path reaching respective semiconductor devices 202 and 302. For example, undesired noise travel through first capacitor plates 812A to ground, and desired power signals travel through second capacitor plates 812B and through the IC redistribution vias 510 (See FIG. 14A). One path may go through the first feedthrough vias 206 (or interconnect vias) to reach the first semiconductor device 202. Note that the path may reach multiple first semiconductor devices 202 if there are more devices 202 in the top die 250. Another path may go through the second feedthrough via 406 (or bypass via) to reach the second semiconductor devices 302. In this path, the power signal skips the metal routings in the top die 250 and goes directly to the second circuit structure 300. Yet in another path, the power signal may travel through the top die 250 and into the second circuit structure 300 through the bond pads 216 and 316. In this longer path, the power signal may also reach the second semiconductor devices 302. In all possible paths, due to the decoupling MIM capacitor 812 filtering the input power signals early in the path (e.g., at the IC redistribution vias 510 above the top die 250 and second circuit structure 300), current spikes, voltage bias fluctuation, and or current resistance drop are decoupled before reaching the respective semiconductor devices 202 and 302.

Figure 17:
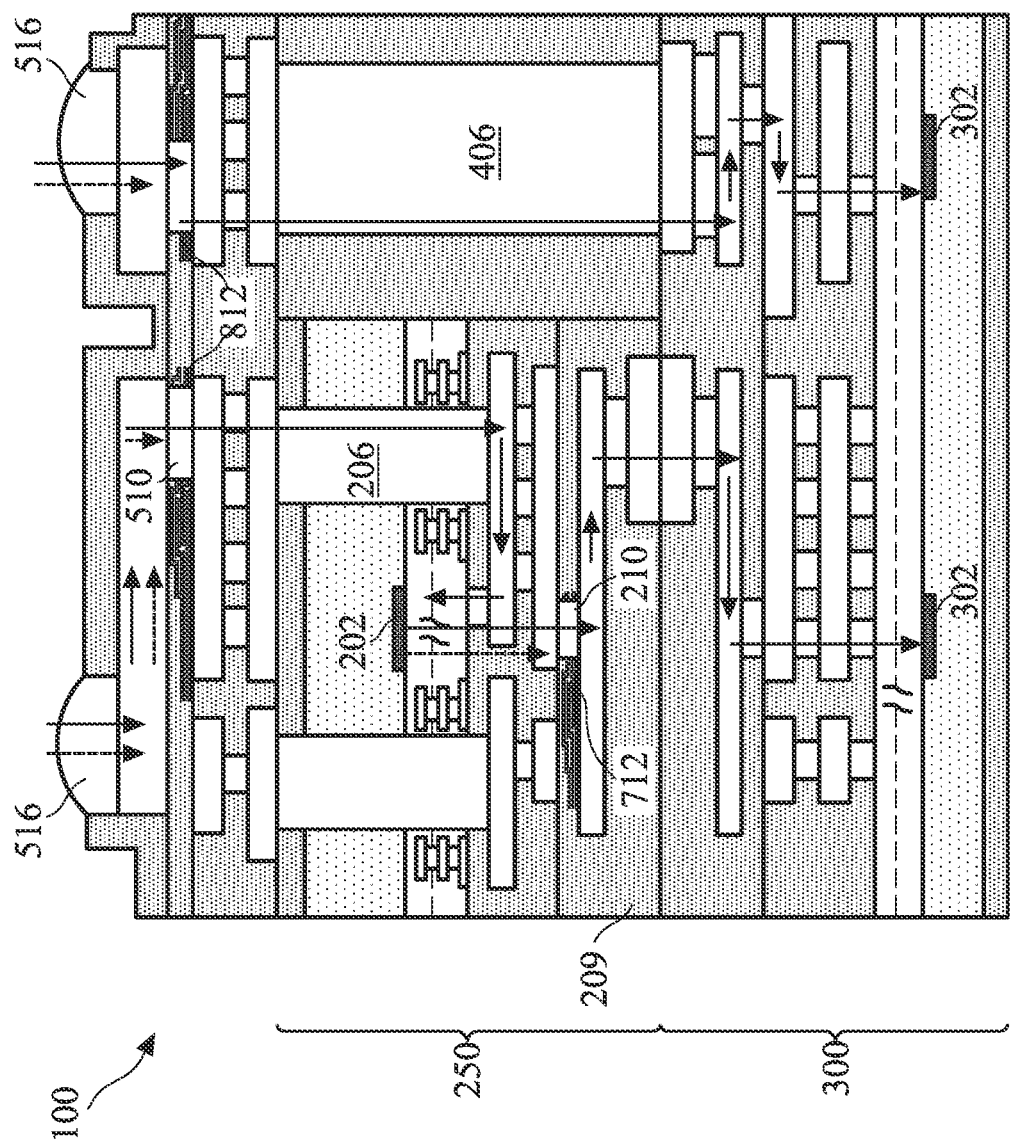
FIG. 17 illustrate a stacked semiconductor structure having one or more integrated MIM capacitors to filter received power signals, according to another embodiment of the present disclosure.

FIG. 17 is another embodiment illustrating a similar stacked semiconductor structure 100 to that of FIG. 16. FIG. 17 also shows example power signal paths. The difference here is the integration of additional MIM capacitor structures 712 located at a lower level and within the top die 250. These structures are not at the IC-level but specific to the top die 250. For example, they are located in the passivation layer 209 and coupled to the redistribution vias 210. The MIM capacitor structures 712 do not filter or decouple the undesired noise coming from the IC bond pads 516 and going to the semiconductor devices 202. This is because they are not along the signal path before reaching the semiconductor devices 202. However, the MIM capacitor structures 712 may be included for filtering out undesired cross-talk and coupling between the semiconductor devices 202 and the semiconductor devices 302. For example, as shown, a signal path going from a semiconductor device 202 passes through the MIM capacitor structures 712 before reaching a semiconductor device 302.

Figure 18A:
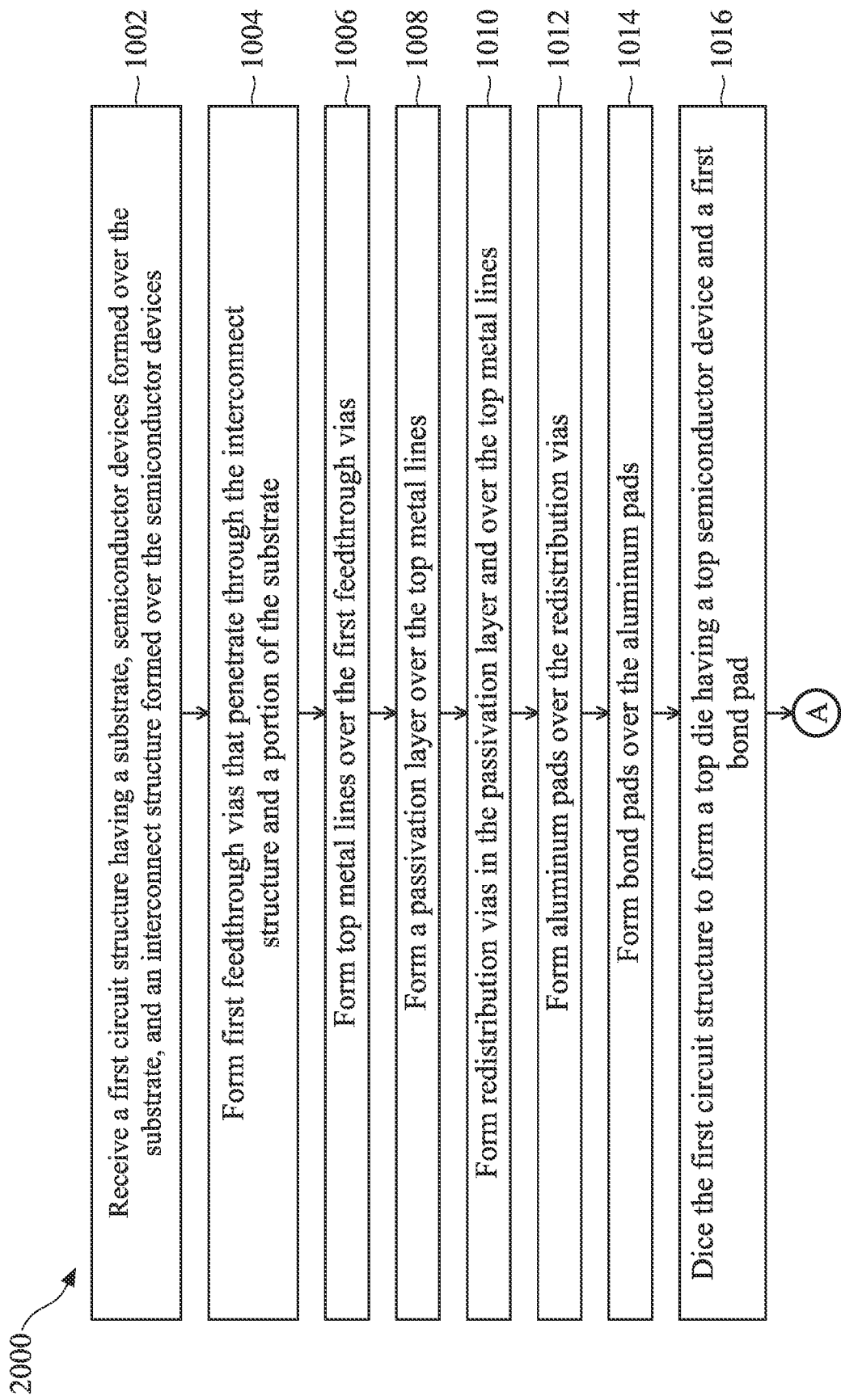
FIGS. 18A-18B illustrate a flow chart of a method to form a stacked semiconductor structure having one or more MIM capacitors, according to another embodiment of the present disclosure.
Figure 18B:
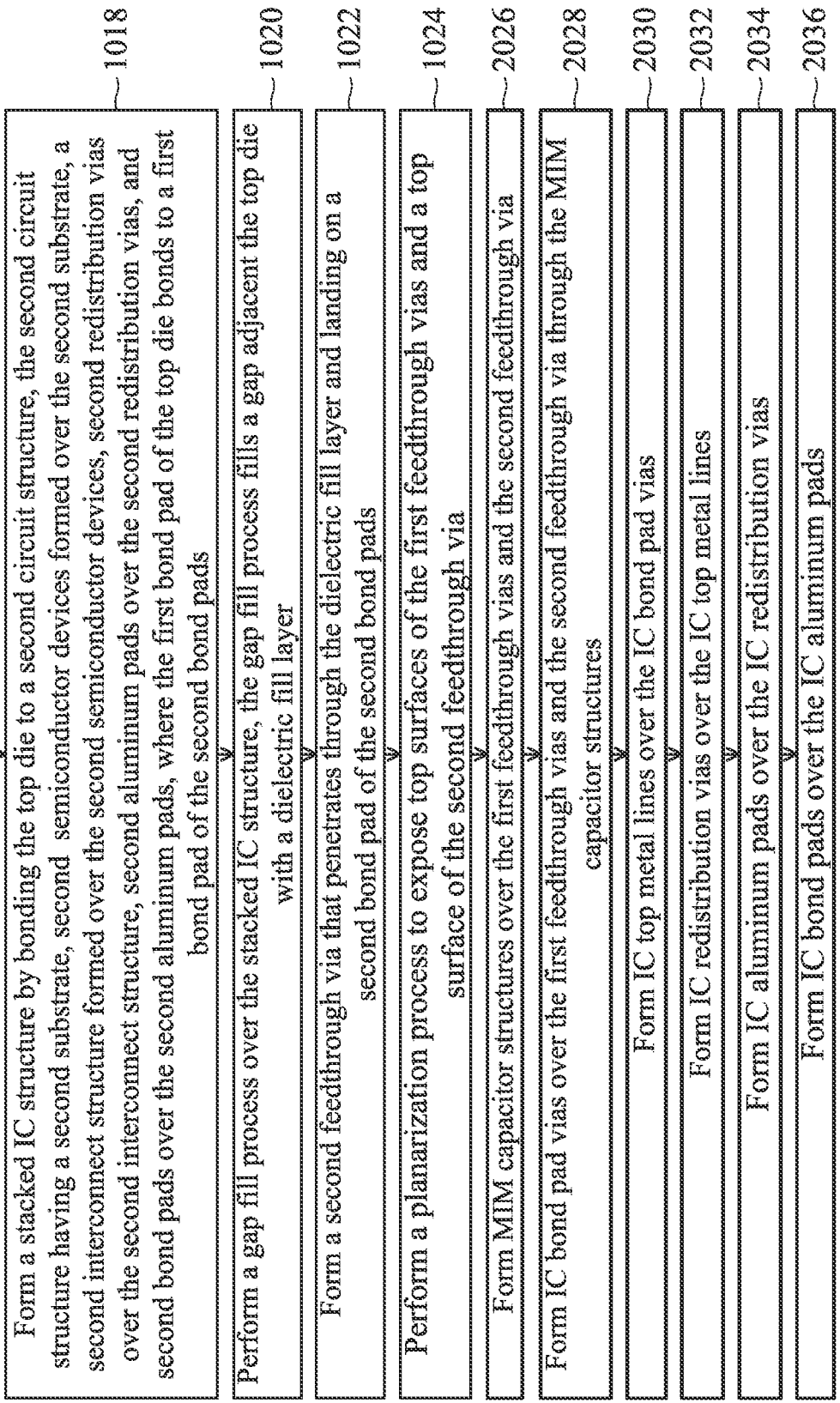

FIGS. 18A-18B is a flow chart of a method 2000 to form a stacked semiconductor structure 100 having one or more MIM capacitors 812 according to another embodiment of the present disclosure. Method 2000 is described below with reference to FIGS. 19-23, which illustrate the formation of a stacked semiconductor structure 100 at intermediate stages of fabrication and processed in accordance with the method 2000. Additional operations can be provided before, during, and after the method 2000, and some of the operations described can be moved, replaced, or eliminated for additional embodiments of method 2000.

Method 2000 is similar to method 1000 described above. Specifically, the operations 1002-1024 in method 2000 may be the same as the operations 1002-1024 in method 1000. As such, the similar operation steps will not be described again for the sake of brevity. The difference in method 2000 is in operations 2026-2036, which indicate a difference in location when forming the MIM capacitor structures 812. Operations 2026-2036 is described in more detail below.

Figure 19:
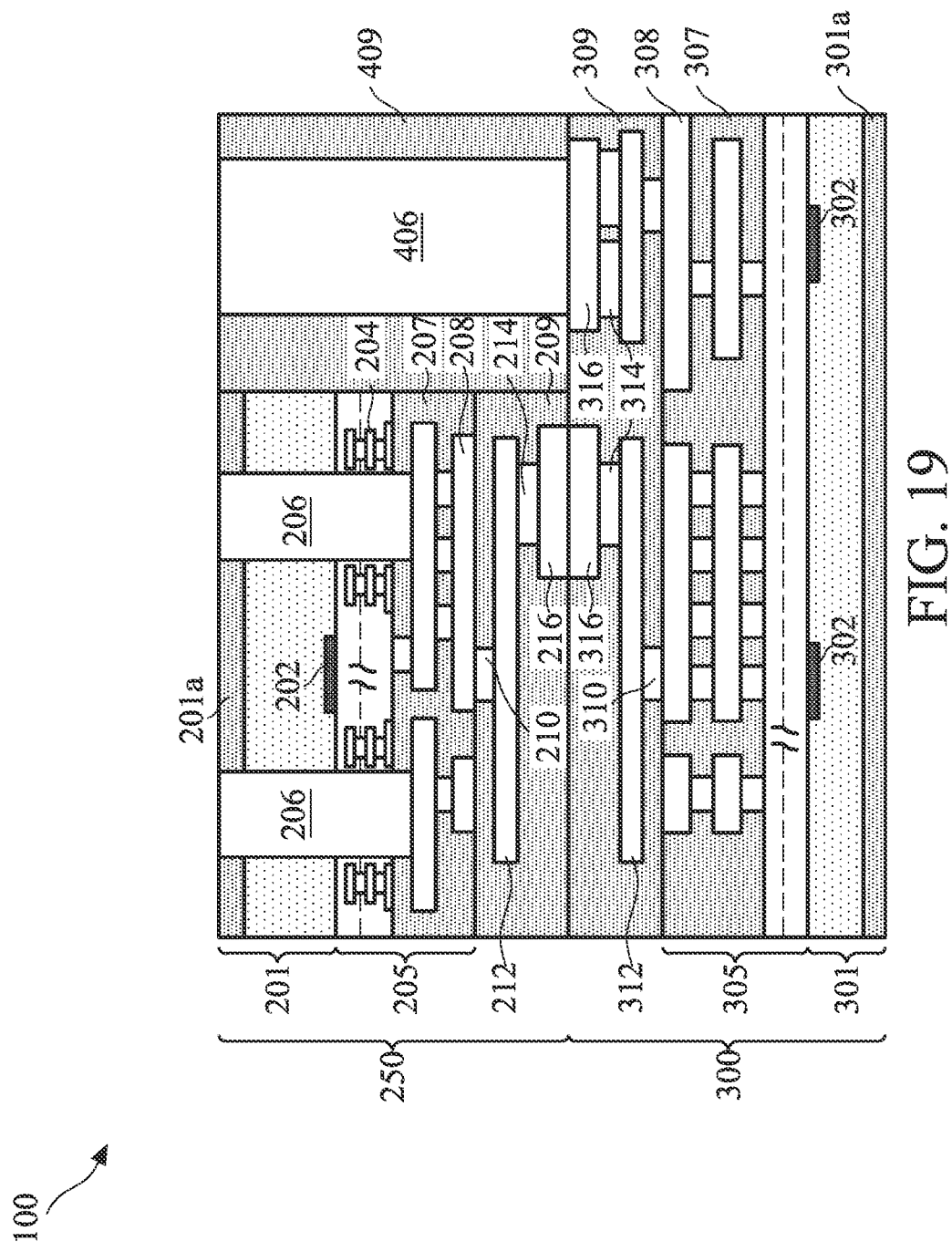
FIGS. 19-23 illustrate the formation of a stacked semiconductor structure at intermediate stages of fabrication and processed in accordance with the method of FIGS. 18A-18B, according to an embodiment of the present disclosure.

FIG. 19 shows a stacked semiconductor structure 100 at the end of operation 1024 in the method 2000. This is similar to the stacked semiconductor structure 100 in FIG. 11. As shown, the first feedthrough vias 206 and the second feedthrough via 406 are exposed.

Figure 20:
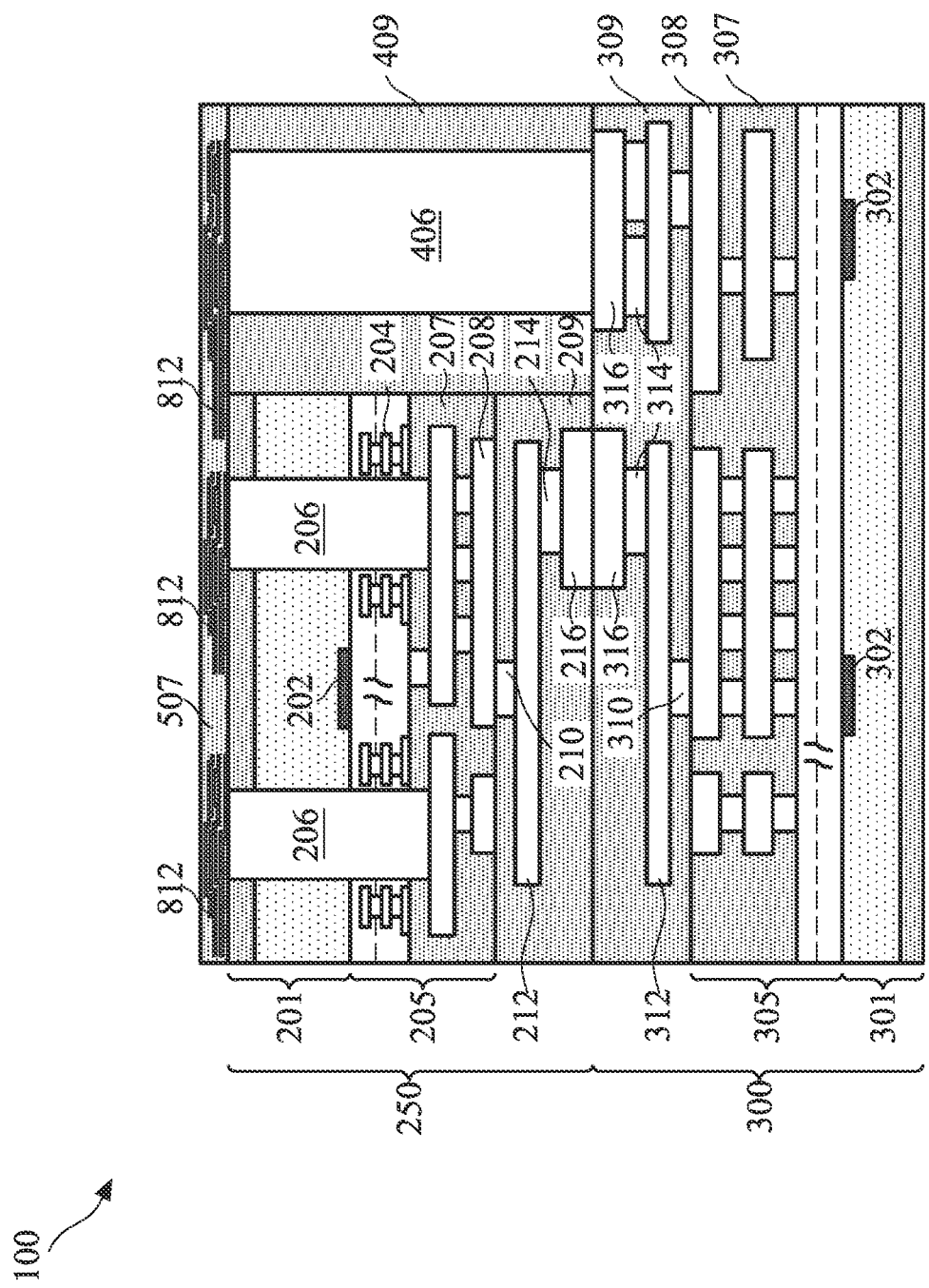

Now referring to FIG. 20, the method 2000 at operation 2026 forms MIM capacitor structures 812 (like the ones described with respect to method 1000) over the first feedthrough vias 206 and the second feedthrough via 406. The MIM capacitor structures 812 are formed in an ILD layer 507. For example, the ILD layer 507 is first deposited over the workpiece and the MIM capacitor structures 812 are formed within the ILD layer 507 by a suitable patterning and lithography process.

Figure 21:
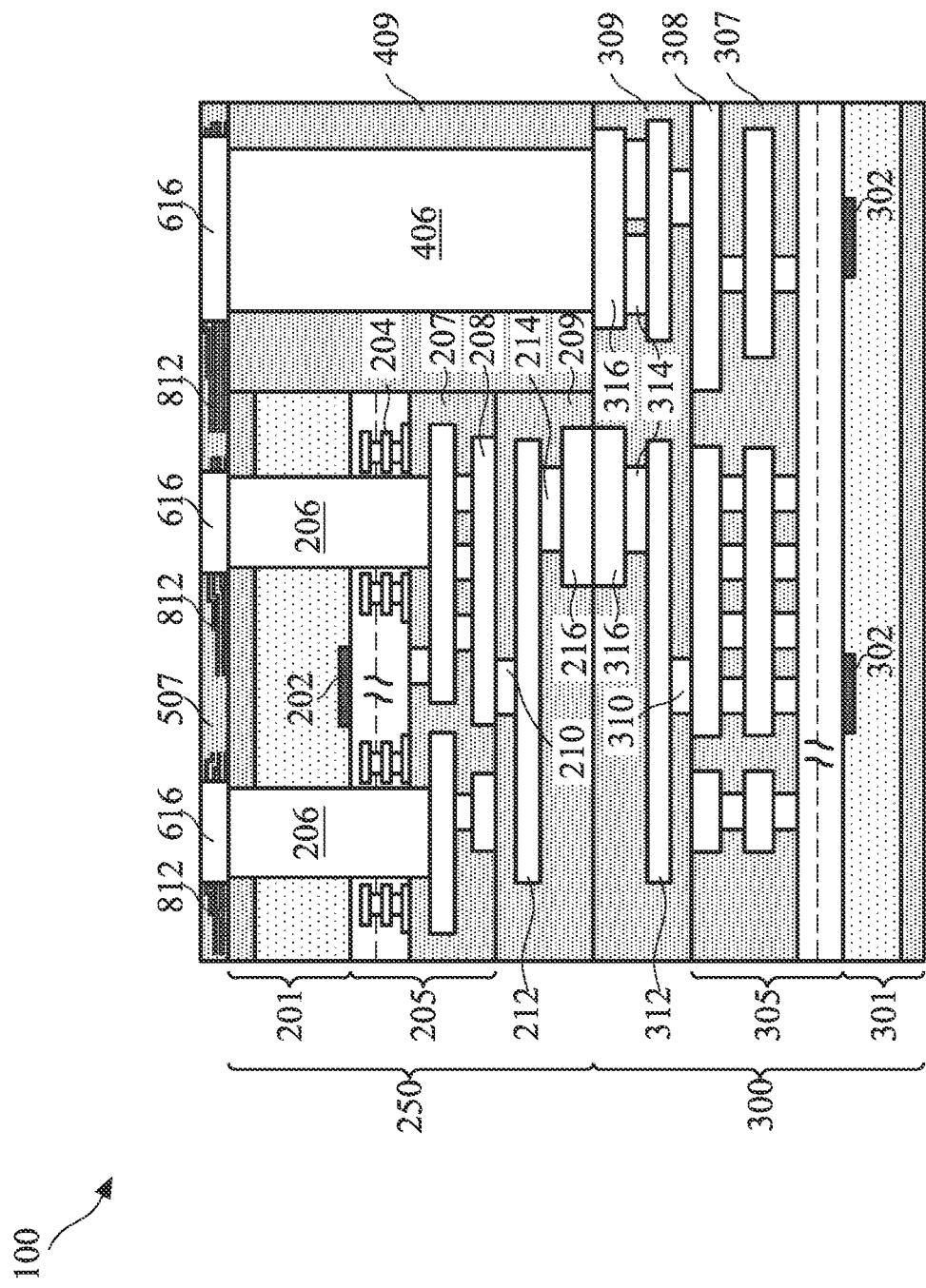

Now referring to FIG. 21, the method 2000 at operation 2028 forms IC bond pad vias 616 over the first feedthrough vias 206 and the second feedthrough via 406 through the MIM capacitor structures 812. The IC bond pad vias 616 land on the first feedthrough vias 206 and the second feedthrough via 406 and penetrates through a portion of the MIM capacitor structures 812 (i.e., portion that connects to one end of the capacitor electrode, for example, capacitor electrode A or B in FIG. 14A). The IC bond pad vias 616 may electrically couple to capacitor electrode A by penetrating through and contacting first conductor plates 812A of the MIM capacitor structures 812. In this case, the electrode B may be connected to a ground power line (not shown). Alternatively, The IC bond pad vias 616 may electrically couple to capacitor electrode B by penetrating through and contacting second conductor plates 812B of the MIM capacitor structures 812. In this case, the electrode A may be connected to a ground power line (not shown).

Figure 22:
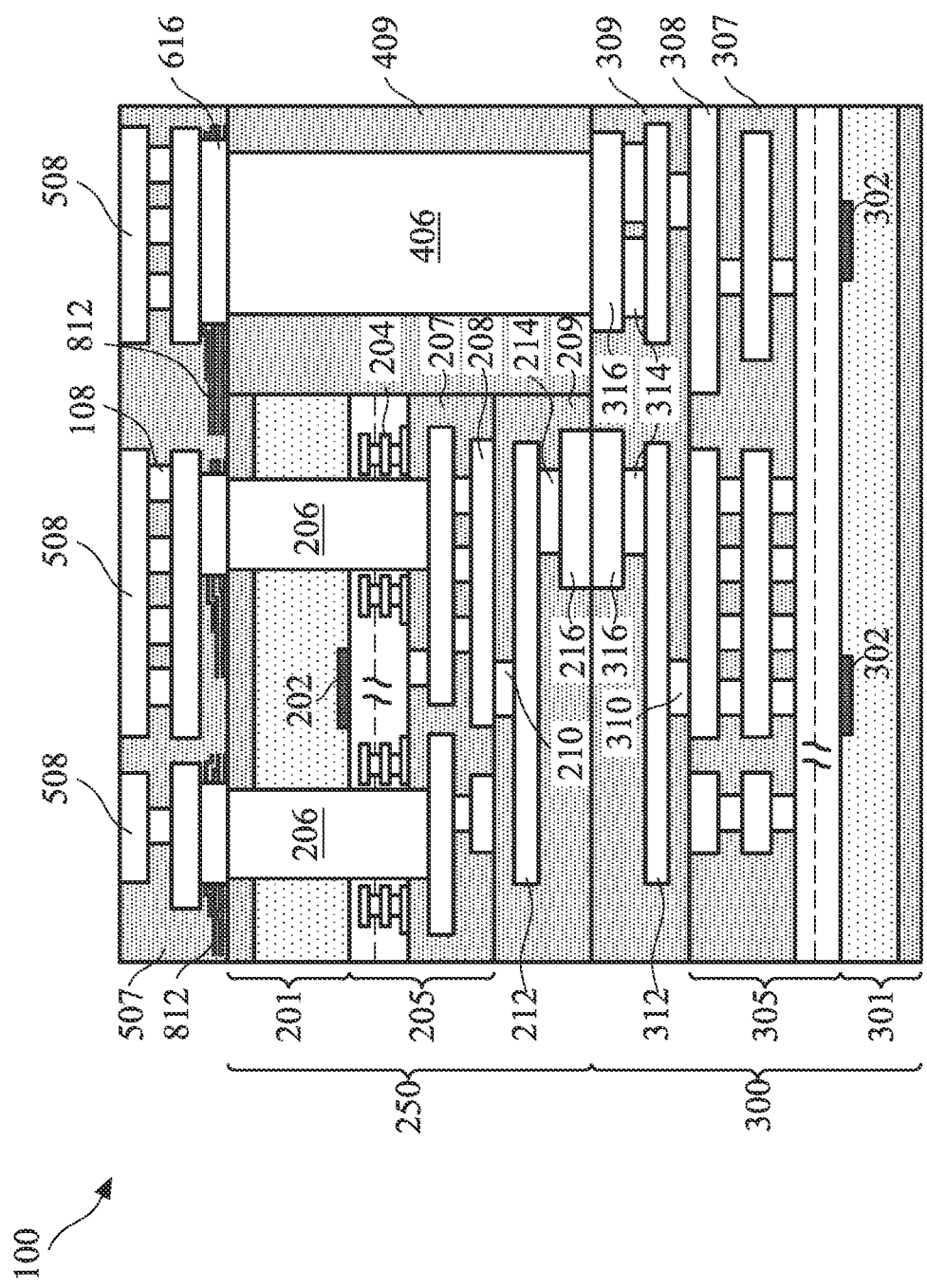

Now referring to FIG. 22, the method 2000 at operation 2030 forms IC top metal lines 508 over the IC bond pad vias 616. The IC top metal lines 508 may include several metal line layers connected by metal vias 108. The IC top metal lines 508 are electrically connected to and may land on the IC bond pad vias 616. The IC top metal lines 508 are formed in the ILD layer 507, which may be multilayered to surround the IC bond pad vias 616, the MIM capacitor structures 812, and the IC top metal lines 508.

Figure 23:
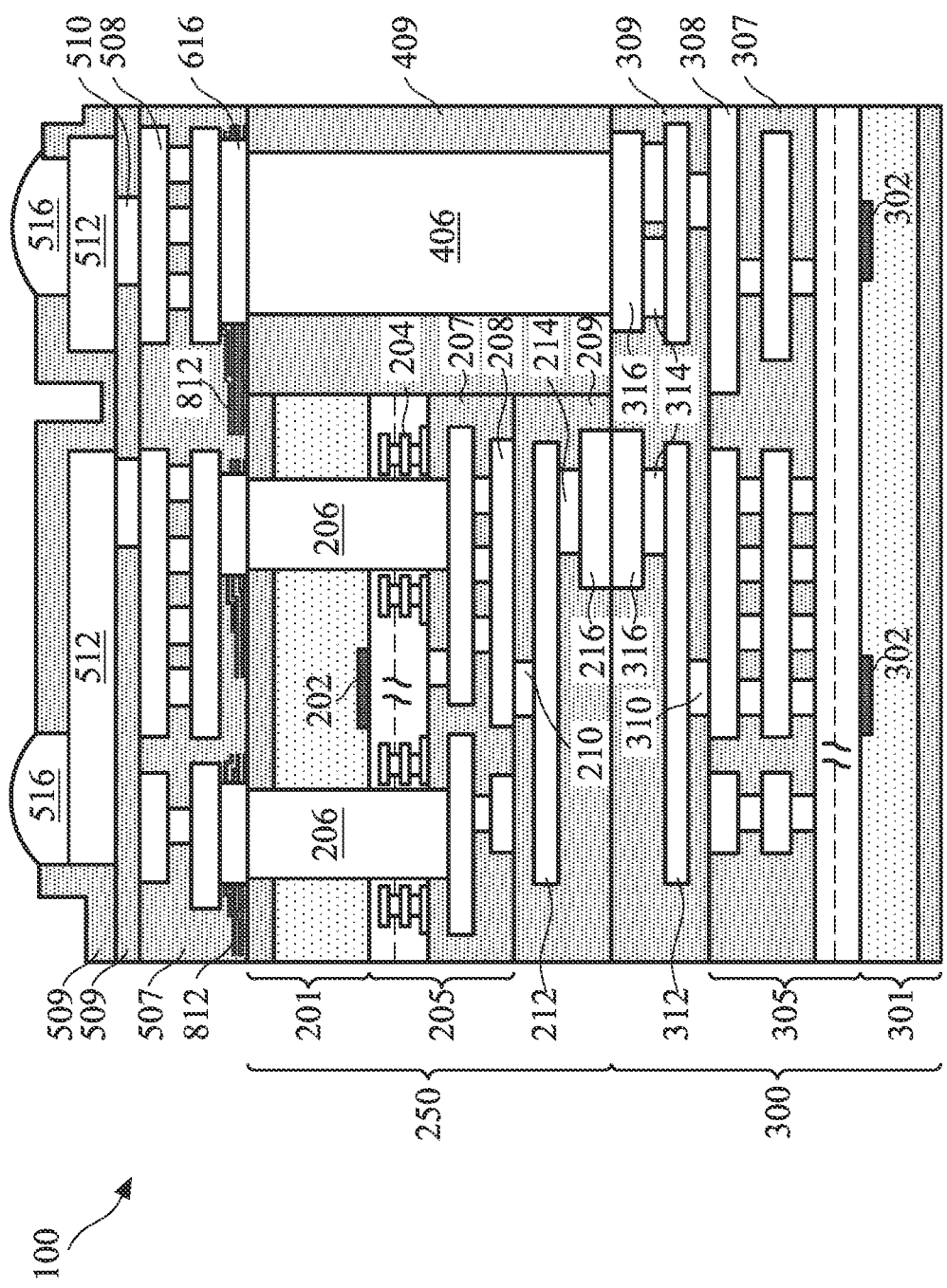

Now referring to FIG. 23, the method 2000 at operation 2032 forms IC redistribution vias 510 over the IC top metal lines 508. The IC redistribution vias 510 are formed in an IC passivation layer 509 which may be first deposited over the workpiece. Note that in this embodiment, unlike in the embodiment of method 1000, no MIM capacitor structures 812 are formed at this level (i.e., in the IC passivation layer 509), and the IC redistribution vias 510 do not penetrate through any MIM capacitor structures 812.

Still referring to FIG. 23, the method 2000 at operation 2034 forms IC aluminum pads 512 over the IC redistribution vias 510. Still referring to FIG. 23, the method 2000 at operation 2036 forms IC bond pads 516 over the IC aluminum pads 512. The IC aluminum pads 512 and IC bond pads 516 may be formed in the IC passivation layer 509. Like the passivation layers 209 and 309, the IC passivation layer 509 may be multilayered, where the passivation layer has sub layers separately formed that surround the different metal features (e.g., IC redistribution vias 510, IC aluminum pads 512, and IC bond pads 516). The IC redistribution vias 510 and the IC aluminum pads 512 are different parts of an IC RDL structure. The IC RDL structure may include additional redistribution routing lines or vias. The IC redistribution vias 510 are vias connecting the IC RDL structure to the IC top metal lines 508. In an embodiment, the IC bond pads 516 are where input power signals are received.

Note that for method 2000, the MIM capacitor structures 812 are formed in an additional layer (i.e., a sub layer of ILD layer 507) directly between the first and second feedthrough vias 206 and 406 and the IC top metal lines 508. This involves an additional process step than that of method 1000, where the MIM capacitor structures are formed in the IC passivation layer 509 closer to the IC bond pads 516. Note that in another embodiment like in FIG. 17 (not shown here), MIM capacitor structures 712 may also be present in the stacked semiconductor structure 100 as shown in FIG. 23.

Figure 24:
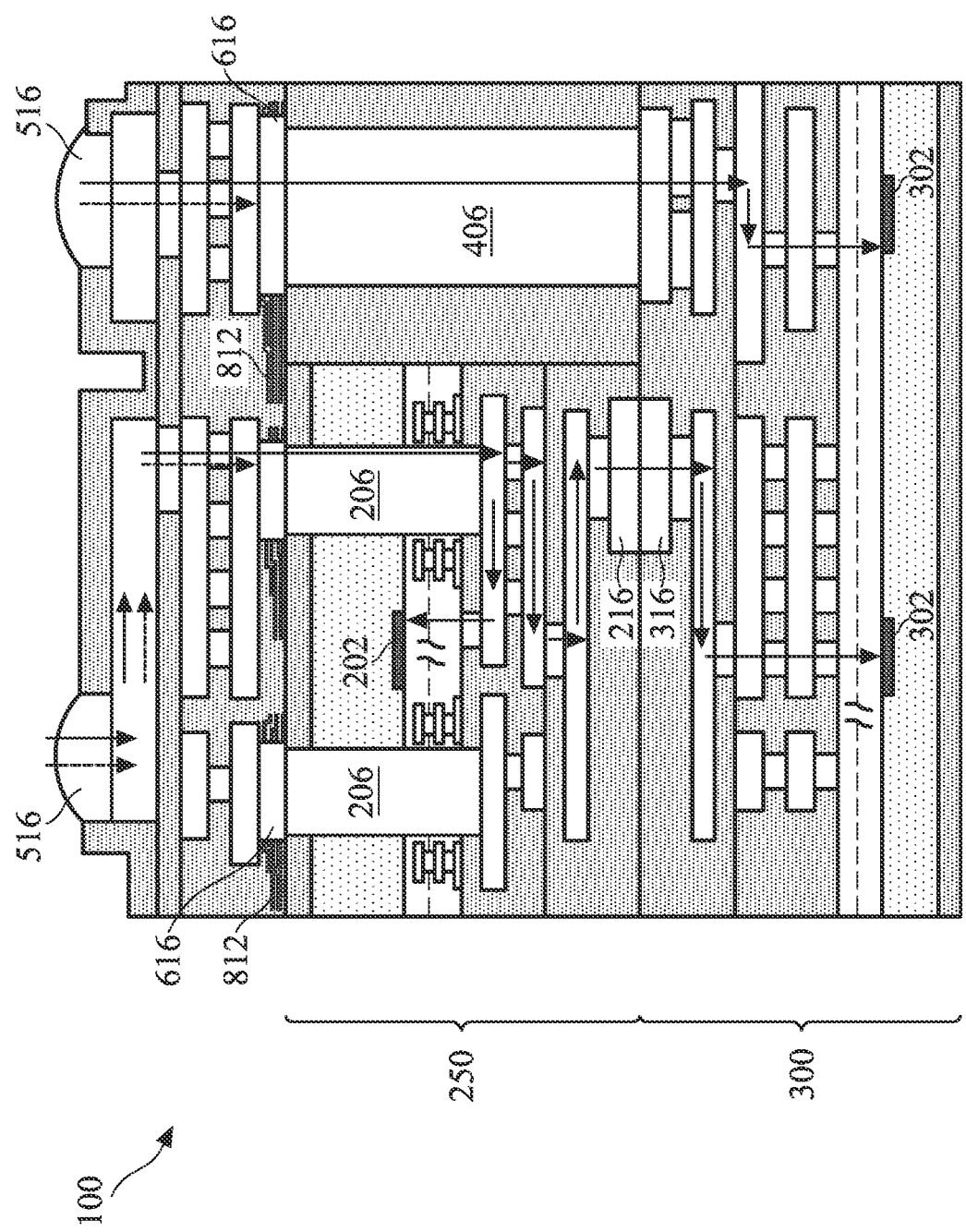
FIG. 24 illustrate a stacked semiconductor structure having one or more integrated MIM capacitors to filter received power signals, according to another embodiment of the present disclosure.

FIG. 24 illustrate the stacked semiconductor structure 100 of FIG. 23. Additionally, FIG. 24 shows solid and dashed arrows representing input power signals. The arrows demonstrate how the one or more integrated MIM capacitors 812 filter the received input power signals, according to an embodiment of the present disclosure. As shown, the stacked semiconductor structure 100 receives input power signals through the IC bond pads 516. The input power signals may include desired power signals (solid arrows) and undesired noise such as frequency spikes (dashed arrows). The input power signals travel through various metal features (bond pads, aluminum pads, redistribution layers, metal lines, interconnects, vias, etc.) to power respective semiconductor devices 202 and 302. As shown, due to the MIM capacitor structures 812 in the signal path, undesired noise is filtered out and do not reach the respective semiconductor devices 202 and 302. Specifically, the MIM capacitor structures 812 are coupled to the IC bond pad vias 616 in a top IC-level portion of the stacked semiconductor structure 100. The MIM capacitor structures 812 short the undesired noise (dashed arrows) to a ground power line (not shown) such that only the desired power signals (solid arrows) travel through IC bond pad vias 616 down the first and second feedthrough vias 206 and 406 through a path reaching respective semiconductor devices 202 and 302. For example, undesired noise travel through first capacitor plates 812A to ground, and desired power signals travel through second capacitor plates 812B and through the IC bond pad vias 616 (See FIG. 14A). One path may go through the first feedthrough vias 206 (or interconnect vias) to reach the first semiconductor device 202. Note that the path may reach multiple first semiconductor devices 202 if there are more devices 202 in the top die 250. Another path may go through the second feedthrough via 406 (or bypass via) to reach the second semiconductor devices 302. In this path, the power signal skips the metal routings in the top die 250 and goes directly to the second circuit structure 300. Yet in another path, the power signal may travel through the top die 250 and into the second circuit structure 300 through the bond pads 216 and 316. In this longer path, the power signal may also reach the second semiconductor devices 302. In all possible paths, due to the decoupling MIM capacitor 812 filtering the input power signals early in the path (e.g., at the IC bond pad vias 616 above the top die 250 and second circuit structure 300), current spikes, voltage bias fluctuation, and or current resistance drop are decoupled before reaching the respective semiconductor devices 202 and 302.

Figure 25:
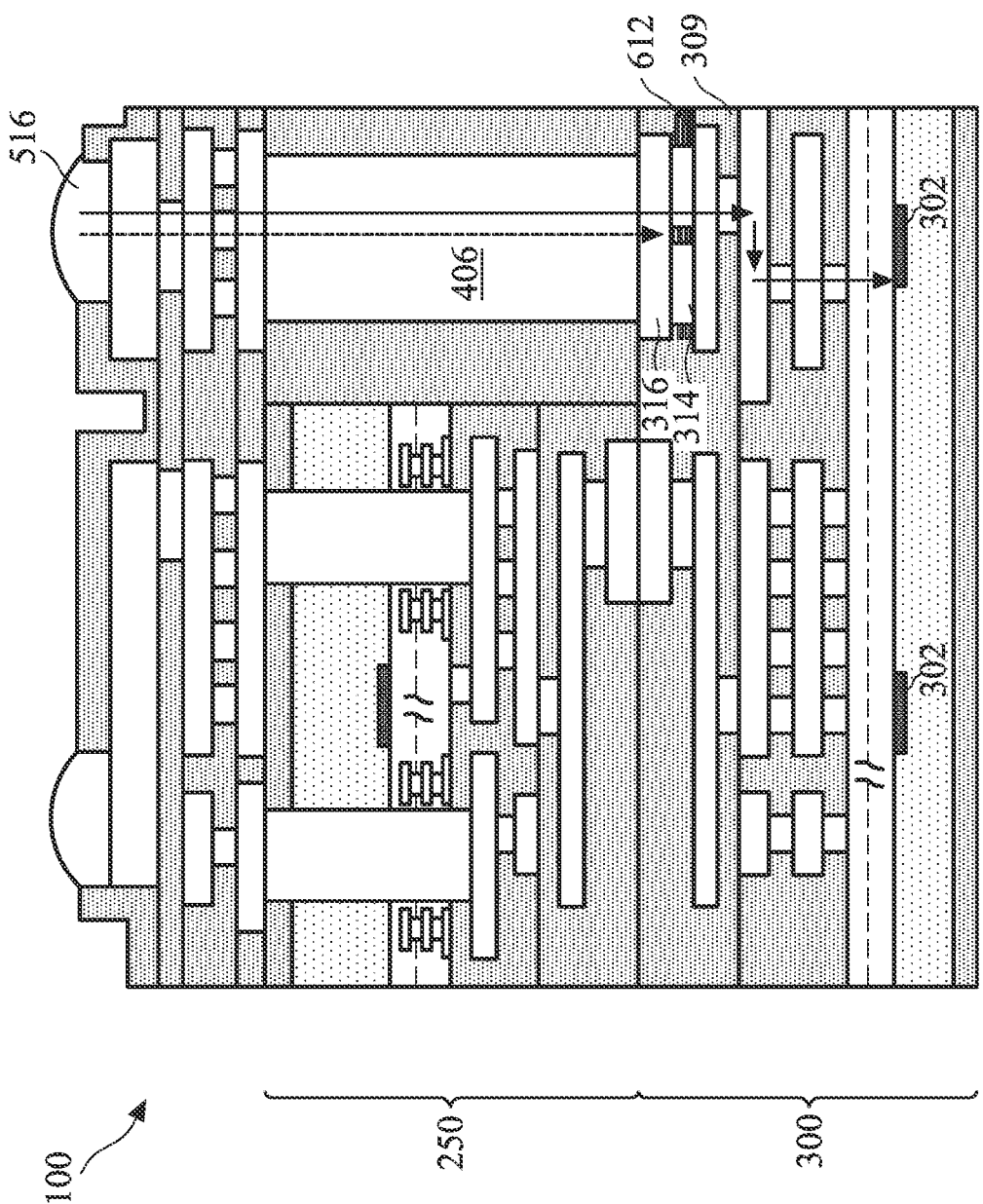
FIGS. 25-27 illustrate stacked semiconductor structures having one or more integrated MIM capacitors to filter received power signals, according to other embodiments of the present disclosure.
Figure 26:
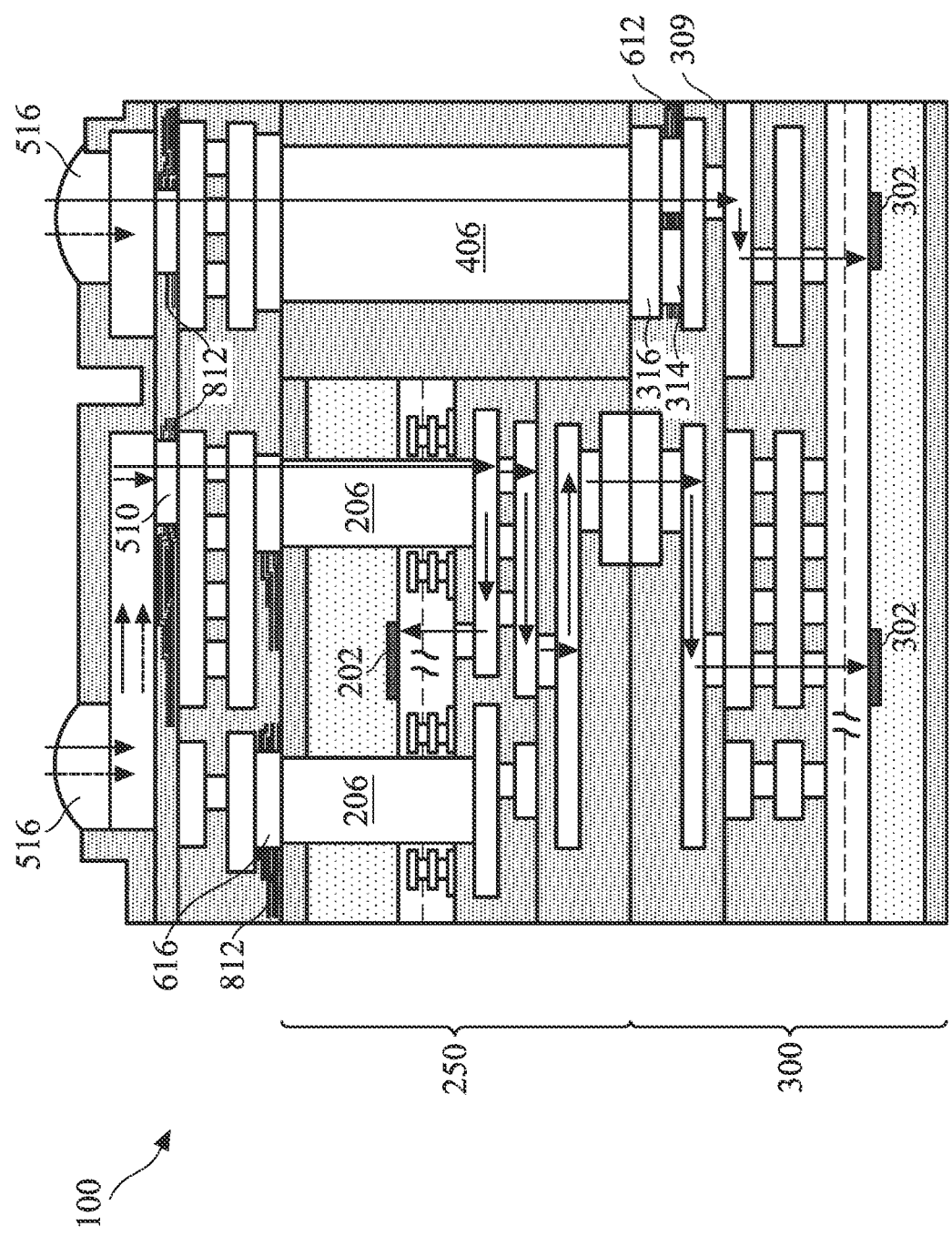
Figure 27:
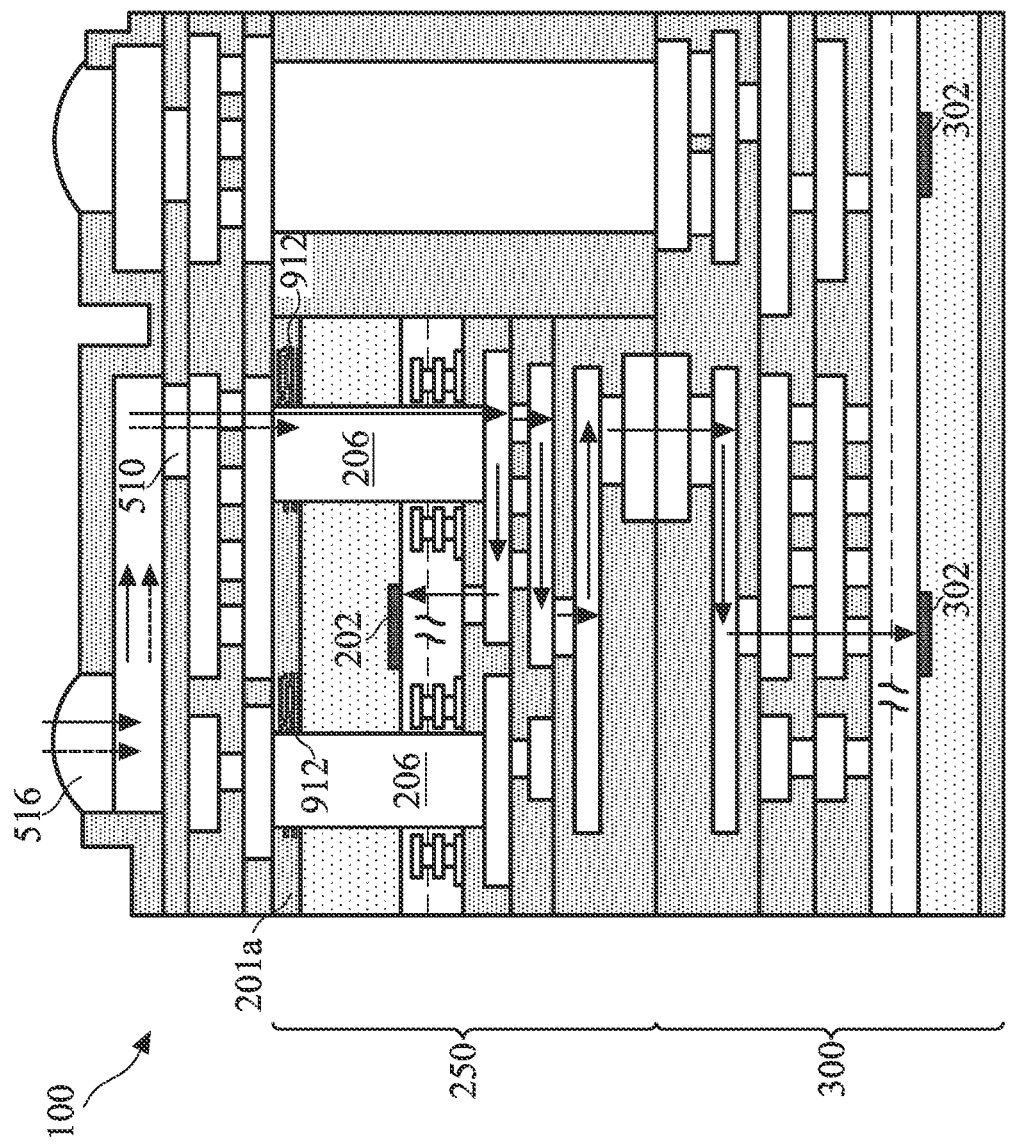

FIGS. 25-27 illustrate stacked semiconductor structures 100 having one or more integrated MIM capacitors according to other embodiments of the present disclosure.

FIG. 25 illustrates an embodiment having MIM capacitor structures 612 located at a lower level and within the second circuit structure 300. These structures are not at the IC-level but specific to the second circuit structure 300. For example, they are located in the passivation layer 309 and coupled to the second bond pad vias 314. Like the MIM capacitor structures 712, the MIM capacitor structures 612 do not filter or decouple the undesired noise coming from the IC bond pads 516 and going to the semiconductor devices 202. This is because they are not along the signal path before reaching the semiconductor devices 202. However, here, the MIM capacitor structures 612 may filter or decouple undesired noise coming from the IC bond pads 516 and going to the semiconductor devices 302. For example, in the signal path that bypasses the top die 250 and travels through the second feedthrough via 406, the MIM capacitor structures 612 filters out noise before it reaches to semiconductor devices 302. As such, for power signals that do not pass through the top die 250 and directly goes to the second circuit structure 300, the MIM capacitors need not be formed in the IC top level of the stacked semiconductor structure 100.

FIG. 26 illustrates a combination embodiment having MIM capacitor structures 812 located at the top IC-level and coupling to the IC redistribution vias 510 and/or coupling to the IC bond pad vias 616 (described in methods 1000 and 2000, respectively). Additionally, this embodiment also shows MIM capacitor structures 612 coupling to second bond pad vias 314 described in FIG. 25. As such, it is possible that signal paths go through multiple MIM capacitor structures for optimized noise filtering.

FIG. 27 illustrates an embodiment having MIM capacitor structures 912 located at a lower level and within the top die 250. These structures are not at the IC-level but specific to the top die 250. For example, they are located in the substrate 201 (or insulator layer 201a of the substrate 201) and coupled directly to the first feedthrough vias 206. Unlike the MIM capacitor structures 712, the MIM capacitor structures 912 does filter or decouple the undesired noise coming from the IC bond pads 516 and going to the semiconductor devices 202. This is because they are along the signal path before reaching the semiconductor devices 202. However, here, the MIM capacitor structures 912 do not filter or decouple undesired noise coming from the IC bond pads 516 that bypasses the top die 250 and going to the semiconductor devices 302. For example, in the signal path that bypasses the top die 250 and travels through the second feedthrough via 406, the MIM capacitor structures 912 are not along the signal path to filter out noise before it reaches to semiconductor devices 302.

The MIM capacitor structures 812 may be referred to as IC-level MIM capacitor structures. These MIM capacitors structures are placed closer to where input power is to be received. They capture and filter the input power signals at a same layer level of the stacked semiconductor structure 100 before the input power signals reach the semiconductor devices 202 and 302. Note that other region specific MIM capacitor structures may also be integrated, such as MIM capacitor structures 612, 712, and 912 as described above. For example, MIM capacitor structures 612 are integrated specific to filter input power signals that power semiconductor devices 302 in the second circuit structure 300. MIM capacitor structures 712 are integrated specific to filter crosstalk between semiconductor devices 202 and 302 in the top die 250 and the second circuit structure 300. And MIM capacitor structures 912 are integrated specific to filter input power signals that power semiconductor devices 202 in the top die 250.

Now referring back to FIG. 23, widths of different redistribution vias and/or bond pad vias that couple to the different MIM capacitor structures are described in more detail below. In an embodiment, the IC redistribution vias 510 have a greater width than the top die redistribution vias 210 and the second circuit structure redistribution vias 310. This is because there may be more freedom in forming bigger IC level redistribution layers at the top of the structure 100, specifically enabling better coupling with the IC-level MIM capacitor structures 812. In an embodiment, the top die redistribution vias 210 and the second circuit structure redistribution vias 310 each have a width ranging between 1 to 2.7 micrometers, and the IC redistribution vias 510 have a width of 3 micrometers. Similarly, in an embodiment, the IC bond pad vias 616 may have a greater width than the top die redistribution vias 210 and the second circuit structure redistribution vias 310. In an embodiment, the IC bond pad vias 616 have a width ranging between 2.5-3.5 micrometers. In an embodiment, the IC bond pad vias 616 have a greater width than the first feedthrough vias 206 and the second feedthrough via 406.

Except for the different aluminum pads described herein (which include aluminum materials), the different metal routings and interconnects described herein (e.g., redistribution vias, redistribution layers, bond pads, feedthrough vias, metal lines, etc.) may include copper materials. The ILD layers described herein may include silicon oxide, a silicon oxide containing material, or a low-K dielectric layer such as TEOS oxide, undoped silicate glass (USG), or doped silicon oxide such as BPSG, FSG, PSG, BSG, and/or other suitable low-K dielectric material. The passivation layers described herein may include silicon oxide, silicon nitride, or a suitable dielectric material. For the sake of simplicity, the ILD layers and passivation layers that encompass multiple metal layers in a same region are referred to as the same ILD layer and/or passivation layer having multi sub layers. In various examples, the ILD and passivation layers may be deposited by chemical vapor deposition (CVD), physical vapor deposition (PVD), atomic layer deposition (ALD), or combinations thereof.

The embodiments described herein referred to the second circuit structure 300 as the bottom structure and having memory devices, and the top die 250 as from a first circuit structure 200 having logic devices. However, in other embodiments, the bottom structure may be a first circuit structure having logic devices, and the top die may be from a second circuit structure having memory devices. Note also the naming convention of first or second circuit structures, semiconductor devices, passivation layers, etc. may be flipped without departing from the spirit and scope of the present disclosure.

Although not limiting, the present disclosure offers advantages for stacked 3D IC semiconductor structures by incorporating filtering or decoupling capacitors. One example advantage is utilizing super high density MIM capacitors and integrating them closer to the top of the stacked semiconductor structure such that they filter power signals going to both top and bottom stacked semiconductor devices. Another example advantage is incorporating additional region specific MIM capacitors that filter signals only traveling to the bottom devices, the top devices, or between top and bottom devices. Another example advantage is forming the MIM capacitors to couple to bigger redistribution vias and/or bond pad vias for better coupling with the IC-level MIM capacitor structures.

One aspect of the present disclosure pertains to a method of forming a stacked semiconductor structure. The method includes receiving a first circuit structure having semiconductor devices formed over a first substrate, an interconnect structure formed over the semiconductor devices, first feedthrough vias that penetrate through the interconnect structure and a portion of the first substrate, top metal lines over the first feedthrough vias, redistribution vias over the top metal lines, and bond pads over the redistribution vias. The method includes dicing the first circuit structure to form a top die having a top semiconductor device and a first bond pad. The method includes forming a stacked integrated circuit (IC) structure by bonding the top die to a second circuit structure, the second circuit structure having second semiconductor devices formed over a second substrate, a second interconnect structure formed over the second semiconductor devices, second redistribution vias over the second interconnect structure, and second bond pads over the second redistribution vias. The first bond pad of the top die bonds to a first bond pad of the second bond pads. The method includes performing a planarization process to expose top surfaces of the first feedthrough vias. The method includes forming IC top metal lines over the first feedthrough vias, forming an IC passivation layer over the IC top metal lines, forming metal-insulator-metal (MIM) capacitor structures in the IC passivation layer, forming IC redistribution vias penetrating through the MIM capacitor structures and the IC passivation layer to land on the IC top metal lines, forming IC aluminum pads over the IC redistribution vias, and forming IC bond pads over the IC aluminum pads.

In an embodiment, one of the MIM capacitor structures is a first MIM capacitor formed along a power signal path between the IC bond pads and the top semiconductor device, the first MIM capacitor having one electrode electrically connected to the power signal path and another electrode electrically connected to a ground power line.

In an embodiment, the method further includes performing a gap fill process over the stacked IC structure, the gap fill process fills a gap adjacent the top die with a dielectric fill layer and forming a second feedthrough via that penetrates through the dielectric fill layer and landing on a second bond pad of the second bond pads. The forming of the IC top metal lines also forms IC top metal lines over the second feedthrough via. In a further embodiment, another one of the MIM capacitor structures is a second MIM capacitor formed along a power signal path between the IC bond pads and a bottom semiconductor device of the second semiconductor devices, the second MIM capacitor having one electrode electrically connected to the power signal path and another electrode electrically connected to a ground power line.

In an embodiment, the method further includes forming a top die MIM capacitor structure in the first circuit structure. The top die MIM capacitor structure is disposed between the top metal lines of the first circuit structure and the bond pads of the first circuit structure, and the redistribution vias of the first circuit structure is formed through the top die MIM capacitor structure. In a further embodiment, the top die MIM capacitor structure is a top die MIM capacitor formed along a signal path between the top semiconductor device and a bottom semiconductor device of the second semiconductor devices, the top die MIM capacitor having one electrode electrically connected to the signal path and another electrode electrically connected to a ground power line.

In an embodiment, the top semiconductor device is a logic device, and the second semiconductor devices are memory devices.

In an embodiment, the IC redistribution vias have a first width along a first direction, the redistribution vias of the first circuit structure have a second width along the first direction, and the first width is greater than the second width.

Another aspect of the present disclosure pertains to a stacked semiconductor structure. The structure includes a bottom circuit structure having one more first semiconductor devices in a first transistor region, a first interconnect structure over the first transistor region, a first redistribution via over a top metal line of the first interconnect structure, and a first bonding pad over and electrically connected to the first redistribution via. The structure includes a top die circuit structure having a second semiconductor device in a second transistor region, a second interconnect structure under the second transistor region, an interconnect via penetrating through the second transistor region and a portion of the second interconnect structure to contact a bottom metal line of the second interconnect structure, a second redistribution via under the bottom metal line of the second interconnect structure, and a second bonding pad under and electrically connected to the second redistribution via. The first bonding pad of the bottom circuit structure bonds to the second bonding pad of the top die circuit structure. The structure includes an integrated circuit (IC) top metal line over the top die circuit and landing on the interconnect via, a passivation layer over the IC top metal line, a metal-insulator-metal (MIM) capacitor structure in the passivation layer, an IC redistribution via penetrating through the MIM capacitor structure and the passivation layer to land on the IC top metal line, an IC aluminum pad over the IC redistribution via, and an IC bond pad over the IC aluminum pad.

In an embodiment, the stacked semiconductor structure further includes guard ring structures in the first interconnect structure and surrounding the interconnect via.

In an embodiment, the stacked semiconductor structure further includes a dielectric fill layer adjacent to the top die circuit structure and over the third bonding pad; a bypass via penetrating through the dielectric fill layer and landing on the third bonding pad; a second IC top metal line over the bypass via; a second MIM capacitor structure in the passivation layer and over the second IC top metal line; a second IC redistribution via penetrating through the second MIM capacitor structure and the passivation layer to land on the second IC top metal line; a second IC aluminum pad over the second IC redistribution via; and a second IC bond pad over the second IC aluminum pad. In a further embodiment, the structure further includes a third redistribution via over a second top metal line of the first interconnect structure, where the third bonding pad is over and electrically connected to the third redistribution via, where the first redistribution via electrically connects to a first bottom device of the first semiconductor devices and the third redistribution via electrically connects to a second bottom device of the first semiconductor devices.

In an embodiment, the one or more first semiconductor devices are memory devices, and the second semiconductor device is a logic device.

In an embodiment, the IC redistribution via has a first width along a first direction, the first and second redistribution vias have a second width along the first direction, and the first width is greater than the second width.

Another aspect of the present disclosure pertains to a stacked semiconductor structure. The structure includes a bottom circuit structure having one more first semiconductor devices in a first transistor region, a first interconnect structure over the first transistor region, a first redistribution via over a top metal line of the first interconnect structure, and a first bonding pad over and electrically connected to the first redistribution via. The structure includes a top die circuit structure having a second semiconductor device in a second transistor region, a second interconnect structure under the second transistor region, an interconnect via penetrating through the second transistor region and a portion of the second interconnect structure to contact a bottom metal line of the second interconnect structure, a second redistribution via under the bottom metal line of the second interconnect structure, and a second bonding pad under and electrically connected to the second redistribution via. The first bonding pad of the bottom circuit structure bonds to the second bonding pad of the top die circuit structure. The structure includes an interlayer dielectric (ILD) layer over the interconnect via, a metal-insulator-metal (MIM) capacitor structure in the ILD layer, an integrated circuit (IC) bond pad via penetrating through the MIM capacitor structure and the ILD layer to land on the interconnect via, an IC top metal line over the IC bond pad via, an IC redistribution via over the IC top metal line, and an IC bond pad over the IC aluminum pad.

In an embodiment, the IC bond pad via has a first width along a first direction, the first and second redistribution vias have a second width along the first direction, and the first width is greater than the second width.

In an embodiment, the IC bond pad via has a first width along a first direction, the interconnect via has a second width along the first direction, and the first width is greater than the second width.

In an embodiment, the stacked semiconductor structure further includes a third bonding pad in the bottom circuit structure; a dielectric fill layer adjacent to the top die circuit structure and over the third bonding pad; a bypass via penetrating through the dielectric fill layer and landing on the third bonding pad; a second MIM capacitor structure in the ILD layer and over the bypass via; a second IC bond pad via penetrating through the second MIM capacitor structure and the ILD layer to land on the bypass via; a second IC top metal line over the second IC bond pad via; a second IC redistribution via over the second IC top metal line; a second IC aluminum pad over the second IC redistribution via; and a second IC bond pad over the second IC aluminum pad.

In a further embodiment, the structure includes a third redistribution via over a second top metal line of the first interconnect structure. The third bonding pad is over and electrically connected to the third redistribution via. The first redistribution via electrically connects to a first bottom device of the first semiconductor devices and the third redistribution via electrically connects to a second bottom device of the first semiconductor devices.

In a further embodiment, the IC bond pad via has a first width along a first direction, the bypass via has a second width along the first direction, and the first width is greater than the second width.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a stacked semiconductor structure, comprising:

receiving a first circuit structure having semiconductor devices formed over a first substrate, an interconnect structure formed over the semiconductor devices, first feedthrough vias that penetrate through the interconnect structure and a portion of the first substrate, top metal lines over the first feedthrough vias, redistribution vias over the top metal lines, and bond pads over the redistribution vias;

dicing the first circuit structure to form a top die having a top semiconductor device and a first bond pad;

forming a stacked integrated circuit (IC) structure by bonding the top die to a second circuit structure, the second circuit structure having second semiconductor devices formed over a second substrate, a second interconnect structure formed over the second semiconductor devices, second redistribution vias over the second interconnect structure, and second bond pads over the second redistribution vias, wherein the first bond pad of the top die bonds to a first bond pad of the second bond pads;

performing a planarization process to expose top surfaces of the first feedthrough vias;

forming IC top metal lines over the first feedthrough vias;

forming an IC passivation layer over the IC top metal lines;

forming metal-insulator-metal (MIM) capacitor structures in the IC passivation layer;

forming IC redistribution vias penetrating through the MIM capacitor structures and the IC passivation layer to land on the IC top metal lines;

forming IC aluminum pads over the IC redistribution vias; and forming IC bond pads over the IC aluminum pads.

2. The method of claim 1, wherein one of the MIM capacitor structures is a first MIM capacitor formed along a power signal path between the IC bond pads and the top semiconductor device, the first MIM capacitor having one electrode electrically connected to the power signal path and another electrode electrically connected to a ground power line.

3. The method of claim 1, further comprising:

performing a gap fill process over the stacked IC structure, the gap fill process fills a gap adjacent the top die with a dielectric fill layer; and forming a second feedthrough via that penetrates through the dielectric fill layer and landing on a second bond pad of the second bond pads, wherein the forming of the IC top metal lines also forms IC top metal lines over the second feedthrough via.

4. The method of claim 3, wherein another one of the MIM capacitor structures is a second MIM capacitor formed along a power signal path between the IC bond pads and a bottom semiconductor device of the second semiconductor devices, the second MIM capacitor having one electrode electrically connected to the power signal path and another electrode electrically connected to a ground power line.

5. The method of claim 1, further comprising:

forming a top die MIM capacitor structure in the first circuit structure, wherein the top die MIM capacitor structure is disposed between the top metal lines of the first circuit structure and the bond pads of the first circuit structure, and the redistribution vias of the first circuit structure is formed through the top die MIM capacitor structure.

6. The method of claim 5, wherein the top die MIM capacitor structure is a top die MIM capacitor formed along a signal path between the top semiconductor device and a bottom semiconductor device of the second semiconductor devices, the top die MIM capacitor having one electrode electrically connected to the signal path and another electrode electrically connected to a ground power line.

7. The method of claim 1, wherein the top semiconductor device is a logic device, and the second semiconductor devices are memory devices.

8. The method of claim 1, wherein the IC redistribution vias have a first width along a first direction, the redistribution vias of the first circuit structure have a second width along the first direction, and the first width is greater than the second width.

9. A stacked semiconductor structure, comprising:
a bottom circuit structure having one or more first semiconductor devices in a first transistor region, a first interconnect structure over the first transistor region, a first redistribution via over a top metal line of the first interconnect structure, and a first bonding pad over and electrically connected to the first redistribution via;
a top die circuit structure having a second semiconductor device in a second transistor region, a second interconnect structure under the second transistor region, an interconnect via penetrating through the second transistor region and a portion of the second interconnect structure to contact a bottom metal line of the second interconnect structure, a second redistribution via under the bottom metal line of the second interconnect structure, and a second bonding pad under and electrically connected to the second redistribution via, wherein the first bonding pad of the bottom circuit structure bonds to the second bonding pad of the top die circuit structure;
an integrated circuit (IC) top metal line over the top die circuit structure and landing on the interconnect via;
a passivation layer over the IC top metal line;
a metal-insulator-metal (MIM) capacitor structure in the passivation layer;
an IC redistribution via penetrating through the MIM capacitor structure and the passivation layer to land on the IC top metal line;
an IC aluminum pad over the IC redistribution via; and
an IC bond pad over the IC aluminum pad.

10. The stacked semiconductor structure of claim 9, further comprising:
guard ring structures in the first interconnect structure and surrounding the interconnect via.

11. The stacked semiconductor structure of claim 9, further comprising:
a third bonding pad in the bottom circuit structure;
a dielectric fill layer adjacent to the top die circuit structure and over the third bonding pad;
a bypass via penetrating through the dielectric fill layer and landing on the third bonding pad;
a second IC top metal line over the bypass via;
a second MIM capacitor structure in the passivation layer and over the second IC top metal line;
a second IC redistribution via penetrating through the second MIM capacitor structure and the passivation layer to land on the second IC top metal line;
a second IC aluminum pad over the second IC redistribution via; and
a second IC bond pad over the second IC aluminum pad.

12. The stacked semiconductor structure of claim 11, further comprising:
a third redistribution via over a second top metal line of the first interconnect structure,
wherein the third bonding pad is over and electrically connected to the third redistribution via,
wherein the first redistribution via electrically connects to a first bottom device of the first semiconductor devices and the third redistribution via electrically connects to a second bottom device of the first semiconductor devices.

13. The stacked semiconductor structure of claim 9, wherein the one or more first semiconductor devices are memory devices, and the second semiconductor device is a logic device.

14. The stacked semiconductor structure of claim 9,
wherein the IC redistribution via has a first width along a first direction,
wherein the first and second redistribution vias have a second width along the first direction, and the first width is greater than the second width.

15. A stacked semiconductor structure, comprising:
a bottom circuit structure having one or more first semiconductor devices in a first transistor region, a first interconnect structure over the first transistor region, a first redistribution via over a top metal line of the first interconnect structure, and a first bonding pad over and electrically connected to the first redistribution via;
a top die circuit structure having a second semiconductor device in a second transistor region, a second interconnect structure under the second transistor region, an interconnect via penetrating through the second transistor region and a portion of the second interconnect structure to contact a bottom metal line of the second interconnect structure, a second redistribution via under the bottom metal line of the second interconnect structure, and a second bonding pad under and electrically connected to the second redistribution via, wherein the first bonding pad of the bottom circuit structure bonds to the second bonding pad of the top die circuit structure;
an interlayer dielectric (ILD) layer over the interconnect via;
a metal-insulator-metal (MIM) capacitor structure in the ILD layer;
an integrated circuit (IC) bond pad via penetrating through the MIM capacitor structure and the ILD layer to land on the interconnect via;
an IC top metal line over the IC bond pad via;
an IC redistribution via over the IC top metal line;
an IC aluminum pad over the IC redistribution via; and
an IC bond pad over the IC aluminum pad.

16. The stacked semiconductor structure of claim 15,
wherein the IC bond pad via has a first width along a first direction,
wherein the first and second redistribution vias have a second width along the first direction, and the first width is greater than the second width.

17. The stacked semiconductor structure of claim 15,
wherein the IC bond pad via has a first width along a first direction,
wherein the interconnect via has a second width along the first direction, and the first width is greater than the second width.

18. The stacked semiconductor structure of claim 15, further comprising:
a third bonding pad in the bottom circuit structure;
a dielectric fill layer adjacent to the top die circuit structure and over the third bonding pad;
a bypass via penetrating through the dielectric fill layer and landing on the third bonding pad;

a second MIM capacitor structure in the ILD layer and over the bypass via;

a second IC bond pad via penetrating through the second MIM capacitor structure and the ILD layer to land on the bypass via;

a second IC top metal line over the second IC bond pad via;

a second IC redistribution via over the second IC top metal line;

a second IC aluminum pad over the second IC redistribution via; and a second IC bond pad over the second IC aluminum pad.

19. The stacked semiconductor structure of claim 18, further comprising:

a third redistribution via over a second top metal line of the first interconnect structure, wherein the third bonding pad is over and electrically connected to the third redistribution via, wherein the first redistribution via electrically connects to a first bottom device of the first semiconductor devices and the third redistribution via electrically connects to a second bottom device of the first semiconductor devices.

20. The stacked semiconductor structure of claim 18, wherein the IC bond pad via has a first width along a first direction, wherein the bypass via has a second width along the first direction, and the first width is greater than the second width.

* * * * *